(12) United States Patent
Kito et al.

(10) Patent No.: US 8,728,919 B2
(45) Date of Patent: May 20, 2014

(54) NON-VOLATILE SEMICONDUCTOR STORAGE DEVICE AND METHOD OF MANUFACTURING THE SAME

(71) Applicants: Masaru Kito, Yokohama (JP); Yoshiaki Fukuzumi, Yokohama (JP); Masaru Kidoh, Komae (JP); Megumi Ishiduki, Yokohama (JP); Yosuke Komori, Yokohama (JP); Hiroyasu Tanaka, Minato (JP); Ryota Katsumata, Yokohama (JP); Hideaki Aochi, Kawasaki (JP)

(72) Inventors: Masaru Kito, Yokohama (JP); Yoshiaki Fukuzumi, Yokohama (JP); Masaru Kidoh, Komae (JP); Megumi Ishiduki, Yokohama (JP); Yosuke Komori, Yokohama (JP); Hiroyasu Tanaka, Minato (JP); Ryota Katsumata, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/723,601

(22) Filed: Dec. 21, 2012

(65) Prior Publication Data

US 2013/0109157 A1 May 2, 2013

Related U.S. Application Data

(62) Division of application No. 12/555,320, filed on Sep. 8, 2009, now Pat. No. 8,338,876.

(30) Foreign Application Priority Data

Dec. 17, 2008 (JP) .................. 2008-320590

(51) Int. Cl.
*H01L 21/20* (2006.01)

(52) U.S. Cl.
USPC ........... 438/478; 257/296; 257/297; 257/298; 257/321; 257/322

(58) Field of Classification Search
CPC ..................... H01L 45/1233; H01L 21/76834; H01L 45/04; H01L 21/76897; H01L 27/2409; H01L 27/11507
USPC .................. 438/478; 257/296–322, E27.084, 257/E21.209, E21.613
See application file for complete search history.

(56) References Cited

U.S. PATENT DOCUMENTS

| | | | | |
|---|---|---|---|---|
| 5,990,509 | A * | 11/1999 | Burns et al. | 257/296 |
| 6,127,209 | A * | 10/2000 | Maeda et al. | 438/151 |
| 7,271,063 | B2 * | 9/2007 | Chung-Zen | 438/257 |
| 7,821,045 | B2 * | 10/2010 | Tang et al. | 257/261 |
| 7,910,973 | B2 * | 3/2011 | Sakaguchi et al. | 257/298 |
| 7,936,004 | B2 * | 5/2011 | Kito et al. | 257/324 |
| 7,982,260 | B2 * | 7/2011 | Fukuzumi et al. | 257/324 |
| 7,994,588 | B2 * | 8/2011 | Yin et al. | 257/390 |
| 8,017,991 | B2 * | 9/2011 | Kim et al. | 257/318 |
| 2005/0199937 | A1 * | 9/2005 | Chang | 257/314 |
| 2007/0252201 | A1 * | 11/2007 | Kito et al. | 257/331 |
| 2007/0290253 | A1 * | 12/2007 | Kito et al. | 257/315 |
| 2008/0171406 | A1 * | 7/2008 | Orimoto et al. | 438/129 |
| 2010/0181612 | A1 * | 7/2010 | Kito et al. | 257/319 |
| 2011/0127597 | A1 * | 6/2011 | Fukuzumi et al. | 257/314 |

FOREIGN PATENT DOCUMENTS

| | | |
|---|---|---|
| JP | 6-338602 | 12/1994 |
| JP | 2007-266143 | 10/2007 |
| WO | WO 2009/075370 A1 | 6/2009 |
| WO | WO 2010/004706 | 1/2010 |

OTHER PUBLICATIONS

Office Action issued Mar. 26, 2013, in Japanese Patent Application No. 2008-320590 (with English-language translation).

\* cited by examiner

*Primary Examiner* — Fernando L Toledo
*Assistant Examiner* — Mohammed Shamsuzzaman
(74) *Attorney, Agent, or Firm* — Oblon, Spivak, McClelland, Maier & Neustadt, L.L.P.

(57) ABSTRACT

A non-volatile semiconductor storage device includes a plurality of memory strings each having a plurality of electrically rewritable memory cells connected in series. Each of the memory strings comprising: a first semiconductor layer including a columnar portion extending in a vertical direction with respect to a substrate; a plurality of first conductive layers formed to surround side surfaces of the columnar portions via insulation layers, and formed at a certain pitch in the vertical direction, the first conductive layers functioning as floating gates of the memory cells; and a plurality of second conductive layers formed to surround the first conductive layers via insulation layers, and functioning as control electrodes of the memory cells. Each of the first conductive layers has a length in the vertical direction that is shorter than a length in the vertical direction of each of the second conductive layers.

8 Claims, 22 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is a divisional of U.S. application Ser. No. 12/555,320 filed Sep. 8, 2009, and is based upon and claims the benefit of priority from the prior Japanese Patent Application No. 2008-320590, filed on Dec. 17, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refined) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is expected that physical improvement limit, such as in breakdown voltage between devices, would be reached unless driving voltage can be scaled. That is, it is likely that difficulties would be encountered in device operation itself.

Therefore, a large number of semiconductor storage devices have been proposed recently where memory cells are arranged in a three-dimensional manner to achieve improved integration of memory devices (see, Japanese Patent Laid-Open No. 2007-266143).

One of the conventional semiconductor storage devices where memory cells are arranged in a three-dimensional manner uses transistors with a cylinder-type structure (see, Japanese Patent Laid-Open No. 2007-266143). Those semiconductor storage devices using transistors with the cylinder-type structure are provided with multiple laminated conductive layers corresponding to gate electrodes and pillar-like columnar semiconductor layers. Each of the columnar semiconductor layers serves as a channel (body) part of each of the transistors. MONOS (Metal-Oxide-Nitride-Oxide-Semiconductor) layers are provided around the columnar semiconductor layers. Such a configuration including laminated conductive layers, columnar semiconductor layers, and MONOS layers is referred to as a "memory string".

In each memory string, MONOS layers are formed across multiple laminated conductive layers without being separated. Therefore, there is some concern that the amount of signal may be reduced due to transfer of electric charges in the MONOS layers. As such, there is a need for ensuring reliability of the semiconductor storage devices.

SUMMARY OF THE INVENTION

One aspect of the present invention provides a non-volatile semiconductor storage device comprising: a plurality of memory strings each having a plurality of electrically rewritable memory cells connected in series, each of the memory strings comprising: a first semiconductor layer including a columnar portion extending in a vertical direction with respect to a substrate; a plurality of first conductive layers formed to surround side surfaces of the columnar portions via insulation layers, and formed at a certain pitch in the vertical direction, the first conductive layers functioning as floating gates of the memory cells; and a plurality of second conductive layers formed to surround the first conductive layers via insulation layers, and functioning as control electrodes of the memory cells, each of the first conductive layers having a length in the vertical direction that is shorter than a length in the vertical direction of each of the second conductive layers.

Another aspect of the present invention provides a non-volatile semiconductor storage device comprising: a plurality of memory strings each having a plurality of electrically rewritable memory cells connected in series, each of the memory strings comprising: a first semiconductor layer including a columnar portion extending in a vertical direction with respect to a substrate; a plurality of first conductive layers formed to surround side surfaces of the columnar portions via insulation layers, and formed at a certain pitch in a vertical direction, the first conductive layers functioning as floating gates of the memory cells; and a plurality of second conductive layers formed to surround the first conductive layers via insulation layers, and functioning as control electrodes of the memory cells, the first conductive layers being formed of polysilicon.

Still another aspect of the present invention provides a method of manufacturing a non-volatile semiconductor storage device having a plurality of memory strings each having a plurality of electrically rewritable memory cells connected in series, the method comprising: forming a plurality of first conductive layers above a substrate via first interlayer insulation layers; forming a first hole to penetrate the plurality of first conductive layers and the first interlayer insulation layers; sequentially forming a second conductive layer and a first semiconductor layer on a side surface of the first hole, the second conductive layer surrounded by an insulation layer; forming a first trench to penetrate the plurality of first conductive layers and the first interlayer insulation layers, the first trench extending in a first direction parallel to the substrate; removing the first interlayer insulation layers via the first trench to form air gaps between the first conductive layers aligned in a vertical direction with respect to the substrate; and oxidizing parts of the second conductive layers via the first trench and the air gaps.

DETAILED DESCRIPTION OF THE EMBODIMENTS

Embodiments of a non-volatile semiconductor storage device according to the present invention will now be described below with reference to the accompanying drawings.

(Configuration of Non-Volatile Semiconductor Storage Device 100 in an Embodiment)

Figure 1:
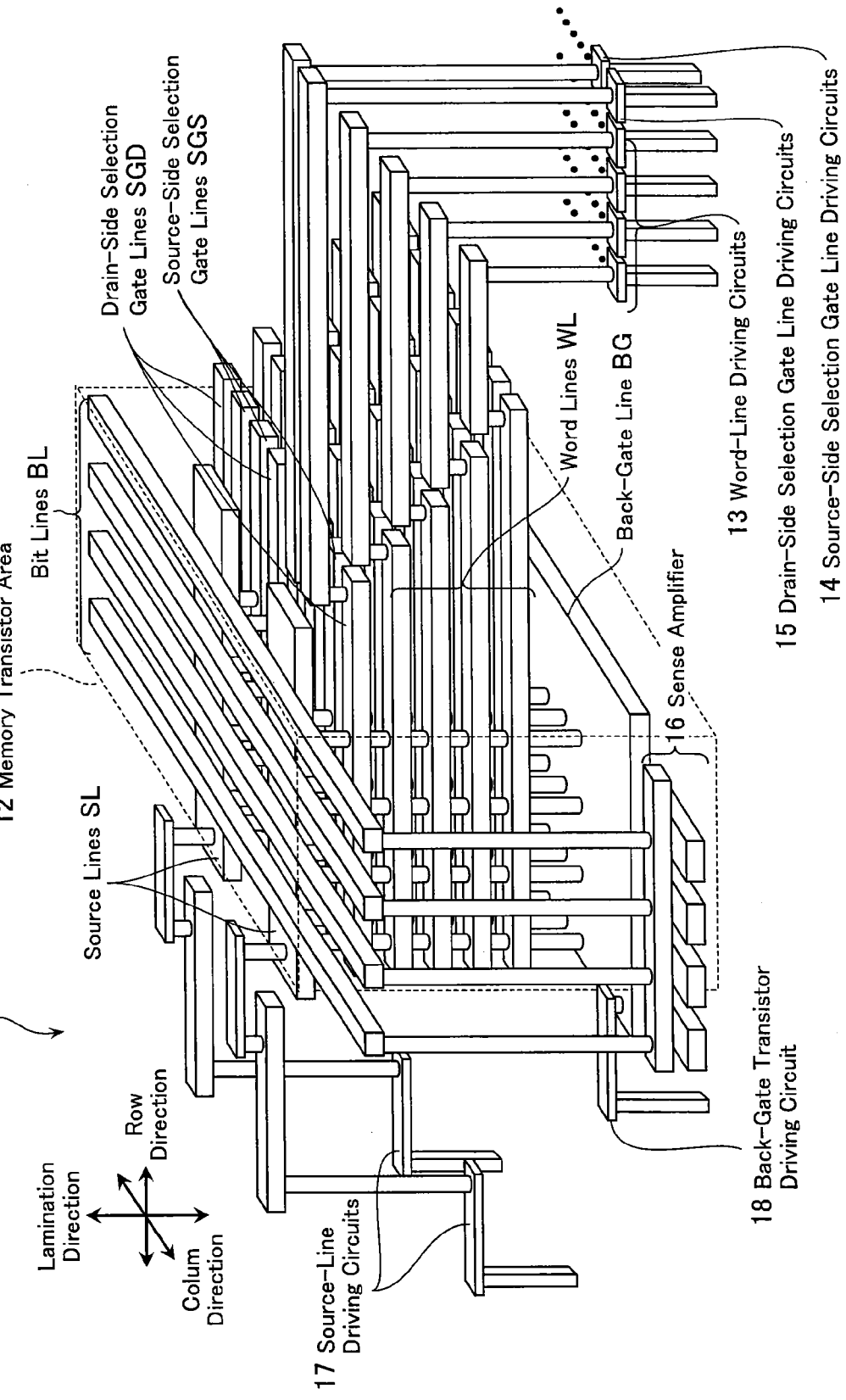
FIG. 1 is a schematic diagram illustrating a configuration of a non-volatile semiconductor storage device 100 according to an embodiment of the present invention.

FIG. 1 schematically illustrates a non-volatile semiconductor storage device 100 according to an embodiment of the present invention. As illustrated in FIG. 1, the non-volatile semiconductor storage device 100 according to the embodiment mainly comprises: a memory transistor area 12; word-line driving circuits 13; source-side selection gate line (SGS) driving circuits 14; drain-side selection gate line (SGD) driving circuits 15; a sense amplifier 16; source-line driving circuits 17; and a back-gate-transistor driving circuit 18. The memory transistor area 12 has memory transistors for storing data. The word-line driving circuits 13 control voltage applied to word lines WL. The source-side selection gate line (SGS) driving circuits 14 control voltage applied to source-side selection gate lines SGS. The drain-side selection gate line (SGD) driving circuits 15 control voltage applied to drain-side selection gate lines SGD. The sense amplifier 16 amplifies a potential read from a memory transistor. The source-line driving circuits 17 control voltage applied to source lines SL. The back-gate-transistor driving circuit 18 controls voltage applied to a back-gate line BG. In addition to this, the non-volatile semiconductor storage device 100 according to the first embodiment comprises bit-line driving circuits that control voltage applied to bit lines BL (not illustrated).

Figure 2:
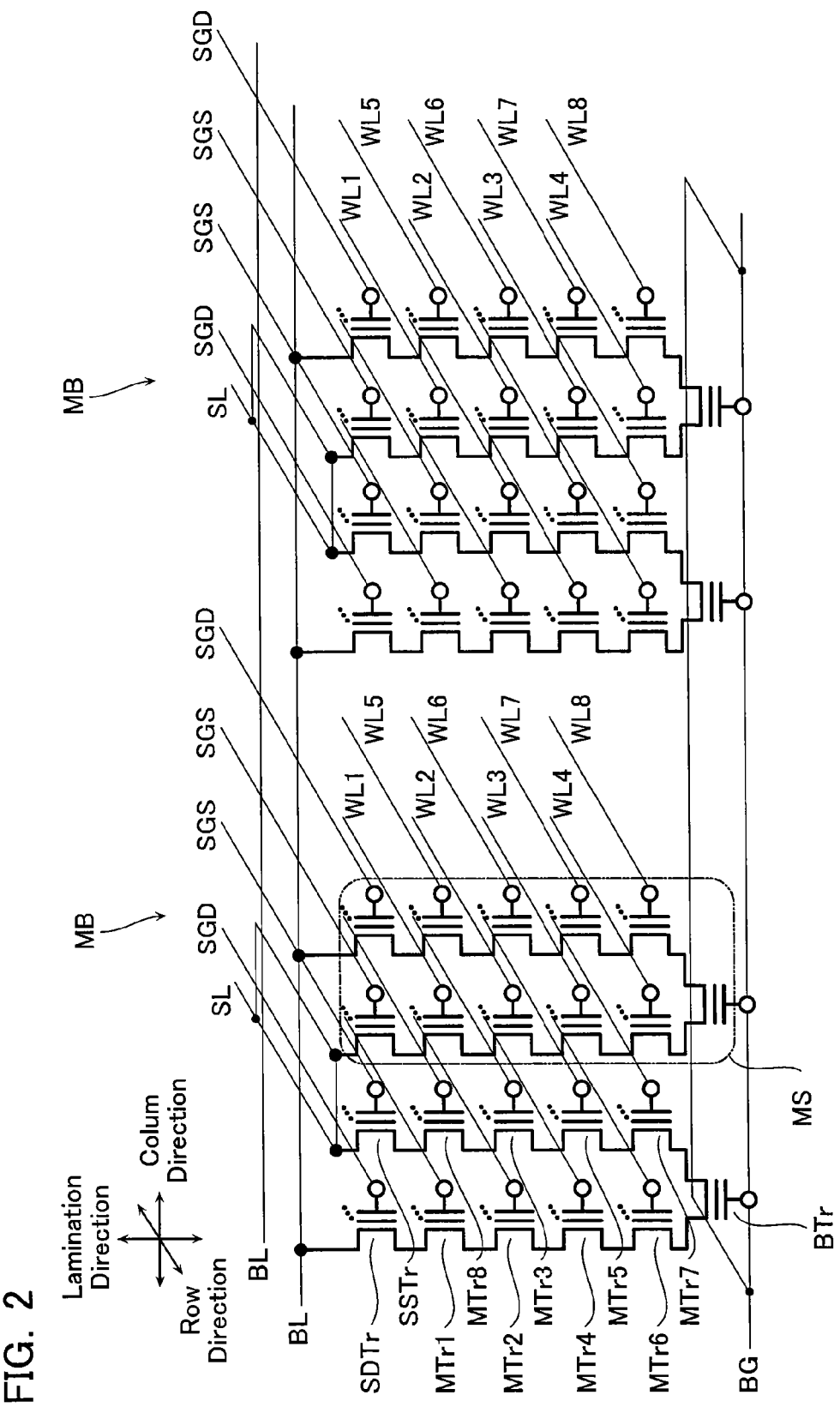
FIG. 2 is a circuit diagram of a part of the non-volatile semiconductor storage device according to the embodiment.

Referring now to FIG. 2, a circuit configuration of the memory transistor area 12 will be described below. FIG. 2 is a circuit diagram of the memory transistor area 12.

As illustrated in FIG. 2, the memory transistor area 12 includes a plurality of memory blocks MB. Each memory block MB comprises a plurality of memory strings MS, source-side selection transistors SSTr, and drain-side selection transistors SDTr. Each memory string MS includes memory transistors MTr1 to MTr8 connected in series and a back-gate transistor BTr. The memory transistors MTr1 to MTr8 cause respective floating gates to capture electric charges for storing information. Each back-gate transistor BTr is connected between a memory transistor MTr4 and a memory transistor MTr5. Each drain-side selection transistor SDTr is connected to one end (a memory transistor MTr1) of a respective memory string MS. Each source-side selection transistor SSTr is connected to the other end (a memory transistor MTr8) of a respective memory string MS.

As illustrated in FIG. 2, in each memory block MB, the control gates of the memory transistors MTr1 aligned in the row direction are commonly connected to a word line WL1 extending in the row direction. Similarly, the control gates of the memory transistors MTr2 to MTr8 aligned in the row direction are commonly connected to word lines WL2 to WL8 extending in the row direction. In addition, the control gates of back-gate transistors BTr that are arranged in a matrix form in the row and column directions are commonly connected to a back-gate line BG.

As illustrated in FIG. 2, in each memory block MB, the control gates of the drain-side selection transistors SDTr aligned in the row direction are commonly connected to a drain-side selection gate line SGD. Each drain-side selection gate line SGD is formed to extend in the row direction across a plurality of memory blocks MB. In addition, the other ends of the drain-side selection transistors SDTr aligned in the column direction are commonly connected to a bit line BL. Each bit line BL is formed to extend in the column direction across a plurality of memory blocks MB.

As illustrated in FIG. 2, in each memory block MB, the control gates of the source-side selection transistors SSTr aligned in the row direction are commonly connected to a source-side selection gate line SGS. Each source-side selection gate line SGS is formed to extend in the row direction across a plurality of memory blocks MB. In addition, the other ends of the source-side selection transistors SSTr arranged in the column direction are commonly connected to a source line SL extending in the row direction. Each source line SL is formed to extend in the row direction across a plurality of memory blocks MB.

Figure 3:
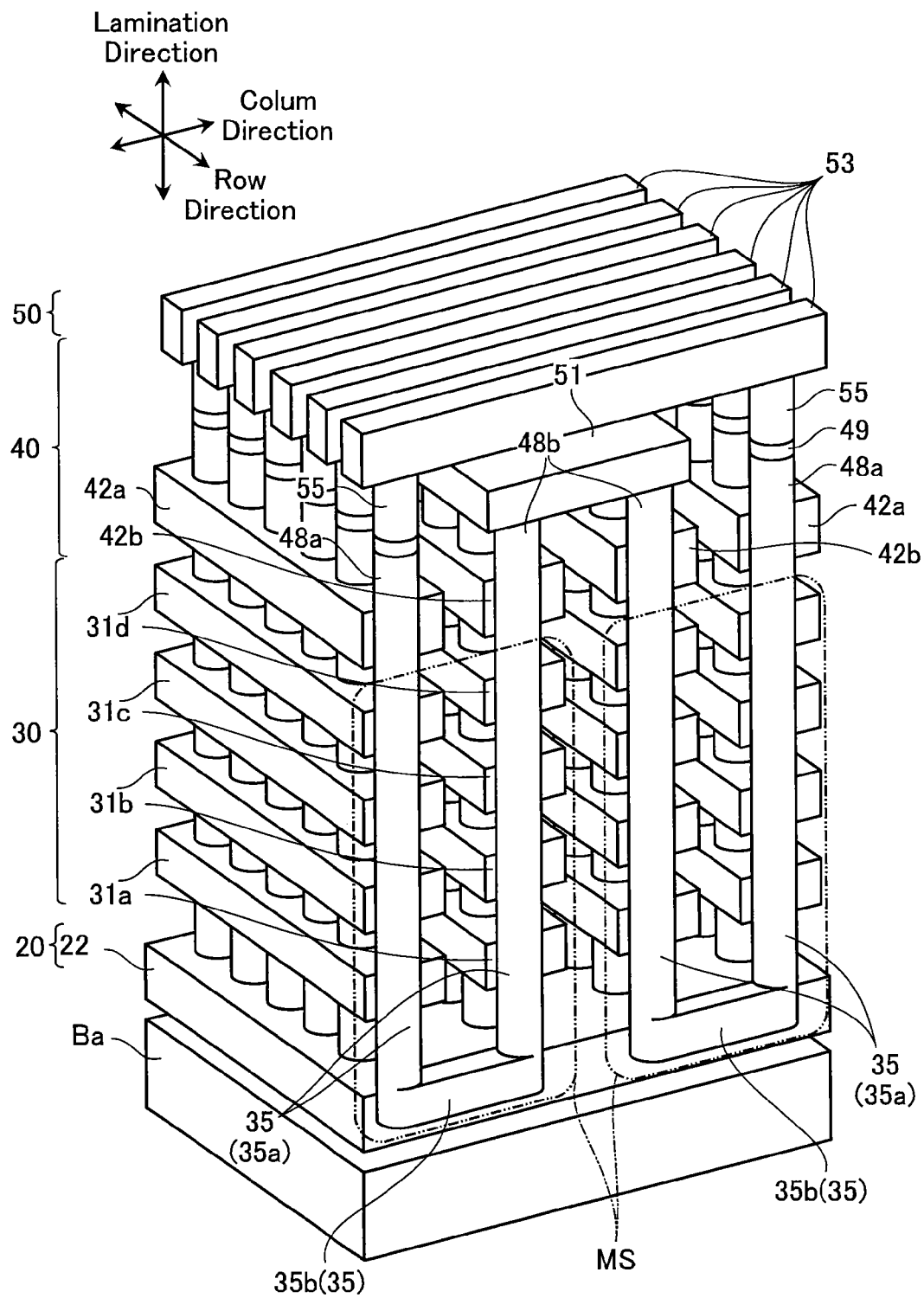
FIG. 3 is a perspective view of the non-volatile semiconductor storage device 100 according to the embodiment where some parts thereof are omitted for clarity.
Figure 4:
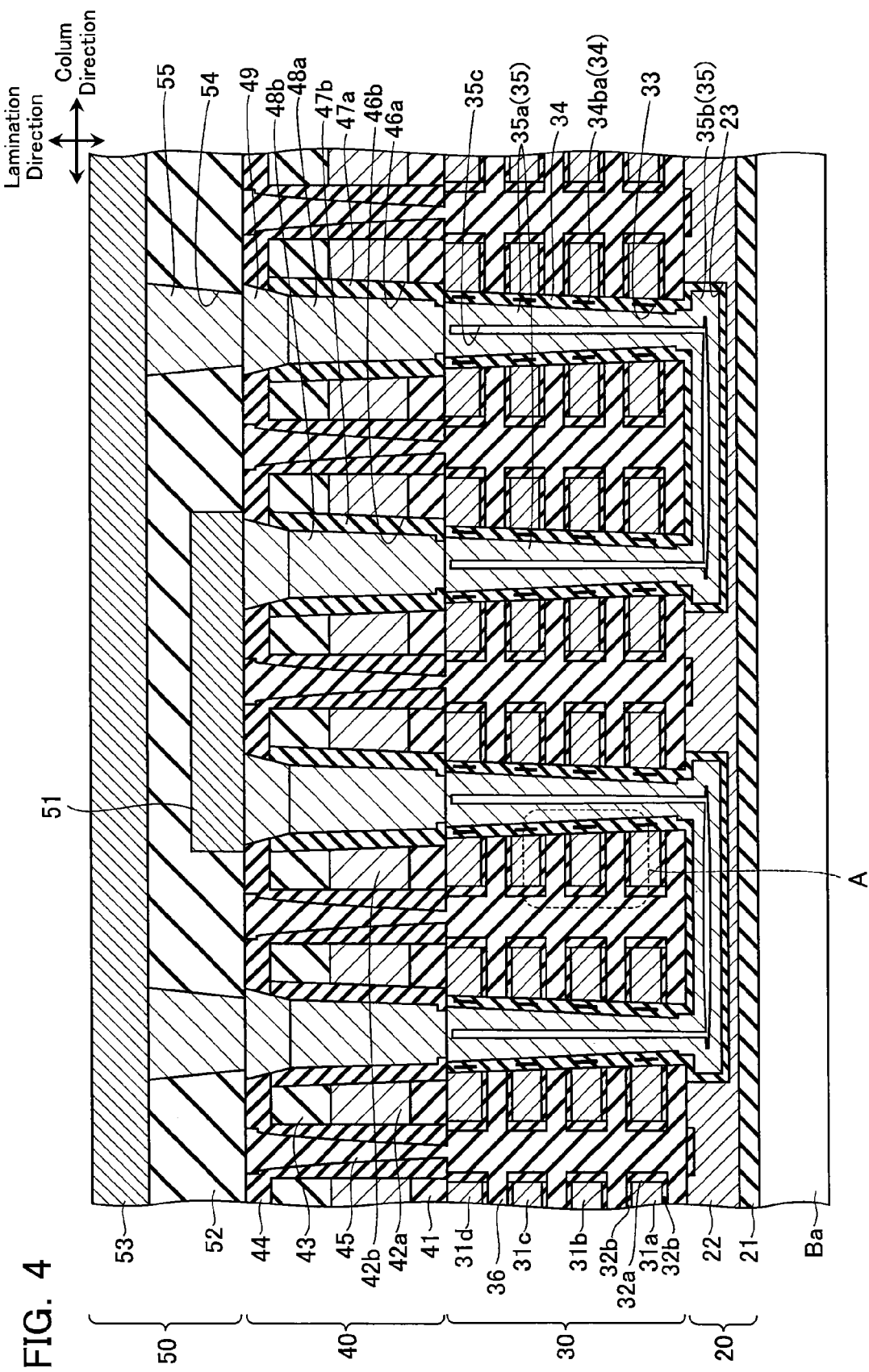
FIG. 4 is a cross-sectional view of the non-volatile semiconductor storage device 100 according to the embodiment.
Figure 5:
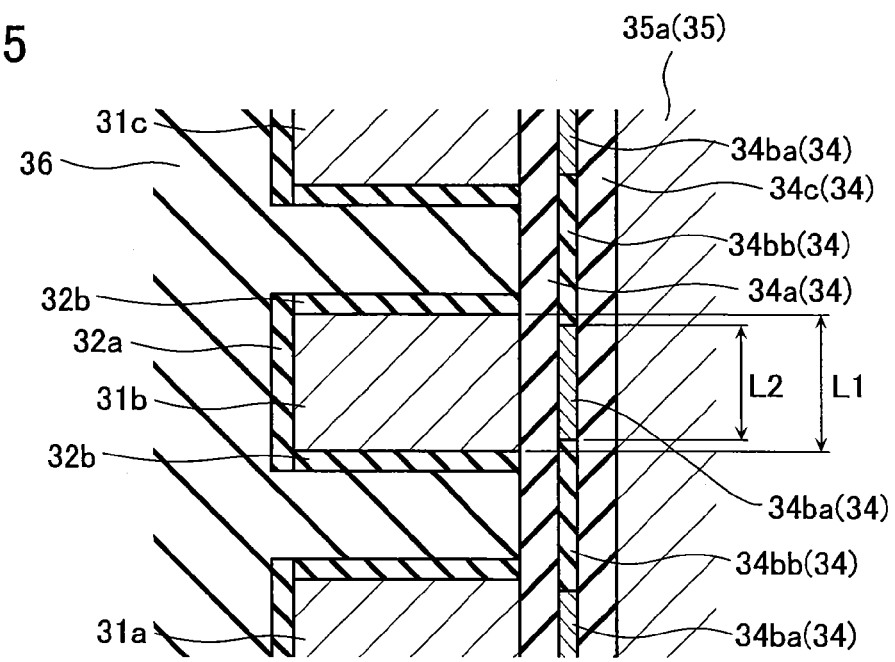
FIG. 5 is an enlarged view of A part of FIG. 4.

Referring now to FIGS. 3 and 4, a lamination structure of the non-volatile semiconductor storage device 100 according to this embodiment that achieves the circuit configuration of FIG. 2 will be described below. FIG. 3 is a perspective view of the memory transistor area 12 in the non-volatile semiconductor storage device 100 of this embodiment where some parts are omitted for clarity, and FIG. 4 is a cross-sectional view of the memory transistor area 12. FIG. 5 is an enlarged view of A part of FIG. 4;

As illustrated in FIGS. 3 and 4, the memory transistor area 12 has a back-gate transistor layer 20, a memory transistor layer 30, a selection transistor layer 40, and a wiring layer 50 that are sequentially formed in a lamination direction (a vertical direction with respect to a substrate) on a semiconductor substrate Ba. The back-gate transistor layer 20 functions as the above-mentioned back-gate transistors BTr. The memory transistor layer 30 functions as the above-mentioned memory strings MS (the memory transistors MTr1 to MTr8). The selection transistor layer 40 functions as the above-mentioned source-side selection transistors SSTr and drain-side selection transistors SDTr.

The back-gate transistor layer 20 has a back-gate insulation layer 21 and a back-gate conductive layer 22 that are sequentially laminated on the semiconductor substrate Ba. The back-gate insulation layer 21 and the back-gate conductive layer 22 are formed to the ends of the memory transistor area 12 so as to expand in the row and column directions.

The back-gate conductive layer 22 is formed to cover the bottom and side surfaces of joining portions 35*b* of U-shaped semiconductor layers 35 described below, and formed as high as the top surfaces of the joining portions 35*b*. The back-gate insulation layer 21 is composed of silicon oxide (SiO$_2$). The back-gate conductive layer 22 is composed of polysilicon (p-Si).

The back-gate transistor layer 20 also has back-gate holes 23 that are formed to dig into the back-gate conductive layer 22. The back-gate holes 23 include apertures having its width direction in the row direction and its longitudinal direction in the column direction. The back-gate holes 23 are formed in the row and column directions with a certain interval therebetween. In other words, the back-gate holes 23 are formed in a matrix form within a plane including the row and column directions.

The memory transistor layer 30 has first to fourth word-line conductive layers 31*a* to 31*d* that are formed at a certain pitch in the lamination direction, and interlayer insulation layers 36 that are formed to fill up the gaps between the first to fourth word-line conductive layers 31*a* to 31*d*.

The first to fourth word-line conductive layers 31*a* to 31*d* are formed to extend in the row direction and in a repeated stripe pattern in the column direction with a certain interval therebetween. As illustrated in FIG. 5, the first to fourth word-line conductive layers 31*a* to 31*d* are each formed with a first length (thickness) L1 in the lamination direction. The first to fourth word-line conductive layers 31*a* to 31*d* are processed in a stepwise manner in relation to each other at their row direction ends. The first to fourth word-line conductive layers 31*a* to 31*d* are composed of polysilicon (p-Si).

In addition, protection layers 32*a* are formed on the side surfaces of the first to fourth word-line conductive layers 31*a* to 31*d* adjacent in the column direction. Oxidized layers 32*b* are formed on the top and bottom surfaces of the first to fourth word-line conductive layers 31*a* to 31*d*.

The protection layers 32*a* are composed of silicon nitride (SiN) having a higher selection ratio associated with diluted hydrofluoric acid treatment than that of the first to fourth word-line conductive layers 31*a* to 31*d* composed of polysilicon. The oxidized layers 32*b* are composed of silicon oxide (SiO$_2$).

The memory transistor layer 30 also has memory holes 33 that are formed to penetrate the first to fourth word-line conductive layers 31*a* to 31*d* and the interlayer insulation layers 36. The memory holes 33 are formed at respective positions near both ends in the column direction of the back-gate holes 23.

In addition, the back-gate transistor layer 20 and the memory transistor layer 30 have memory gate insulation layers 34 and U-shaped semiconductor layers 35.

As illustrated in FIG. 5, the memory gate insulation layers 34 are formed on the respective side surfaces of the memory holes 33 and the back-gate holes 23. Each memory gate insulation layer 34 includes a block insulation layer 34*a*, a floating electrode layer 34*ba*, an isolation/insulation layer 34*bb*, and a tunnel insulation layer 34*c*. Each block insulation layer 34*a* is formed in contact with first to fourth word-line conductive layers 31*a* to 31*d* over the side surface of respective memory hole 33 and back-gate hole 23. Each floating electrode layer 34*ba* and isolation/insulation layer 34*bb* are formed on a side surface of a respective block insulation layer 34*a*. Each floating electrode layer 34*ba* is formed in the same layer as each of the first to fourth word-line conductive layers 31*a* to 31*d*. That is, a plurality of floating electrode layers 34*ba* are formed at a certain pitch in the lamination direction. The isolation/insulation layers 34*bb* are formed between the floating electrode layers 34*ba* aligned in the lamination direction (i.e., they are formed one above the other). The tunnel insulation layers 34*c* are formed in contact with the U-shaped semiconductor layers 35 over the respective side surfaces of the floating electrode layers 34*ba* and the isolation/insulation layers 34*bb*.

In this case, as illustrated in FIG. 5, the floating electrode layers 34*ba* are each formed with a second length (thickness) L2 (L2<L1) in the lamination direction. That is, each floating electrode layer 34*ba* has a second length L2 in the lamination direction that is shorter than the first length L1 in the lamination direction of each of the first to fourth word-line conductive layers 31*a* to 31*d*.

The block insulation layers 34*a*, the isolation/insulation layers 34*bb*, and the tunnel insulation layers 34*c* are composed of silicon oxide (SiO$_2$). The floating electrode layers 34*ba* are composed of polysilicon (p-Si).

Each U-shaped semiconductor layer 35 is formed in a U-shape as viewed from the row direction. Each U-shaped semiconductor layer 35 is formed in contact with a respective tunnel insulation layer 34*c* and to fill up respective back-gate hole 23 and memory hole 33. Each U-shaped semiconductor layer 35 has a joining portion 35*b* that is formed to join a pair of columnar portions 35*a* extending in a vertical direction, as viewed from the row direction, with respect to the semiconductor substrate Ba and the lower ends of the pair of columnar portions 35*a*. The U-shaped semiconductor layers 35 are composed of polysilicon (p-Si).

In the above-mentioned configuration of the back-gate transistor layer 20 and the memory transistor layer 30, the back-gate conductive layer 22 functions as the control gate electrodes of back-gate transistors BTr. The back-gate conductive layer 22 functions as a back-gate line BG. The first to fourth word-line conductive layers 31a to 31d function as the control gate electrodes of memory transistors MTr1 to MTr8, and also function as word lines WL1 to WL8. The floating electrode layers 34ba function as the floating gates of the memory transistors MTr1 to MTr8.

The configuration of the memory transistor layer 30 is restated as follows: the tunnel insulation layers 34c are formed to surround the side surfaces of the columnar portions 35a. The floating electrode layers 34ba and the isolation/insulation layers 34bb are formed to surround the side surfaces of the tunnel insulation layers 34c. The block insulation layers 34a are formed to surround the respective side surfaces of the floating electrode layers 34ba and the isolation/insulation layers 34bb. The first to fourth word-line conductive layers 31a to 31d are formed to surround the side surfaces of the block insulation layers 34a.

The selection transistor layer 40 has first insulation layers 41, drain-side conductive layers 42a, source-side conductive layers 42b, second insulation layers 43, protection layers 44, and interlayer insulation layers 45 that are deposited on the memory transistor layer 30.

The first insulation layers 41 are formed on the fourth word-line conductive layers 31d. The drain-side conductive layers 42a and the source-side conductive layers 42b are formed on the top surfaces of the first insulation layers 41. The drain-side conductive layers 42a and the source-side conductive layers 42b are formed to extend in the row direction and in a repeated stripe pattern in the column direction with a certain interval therebetween. The drain-side conductive layers 42a and the source-side conductive layers 42b are provided in such a way that two drain-side conductive layers 42a and two source-side conductive layers 42b be alternately provided in the column direction. The second insulation layers 43 are formed on the respective top surfaces of the drain-side conductive layers 42a and the source-side conductive layers 42b.

The protection layers 44 are formed to cover the respective side surfaces of the first insulation layers 41, the drain-side conductive layers 42a, and the second insulation layers 43. The protection layers 44 are formed to cover the respective side surfaces of the first insulation layers 41, the source-side conductive layers 42b, and the second insulation layers 43. The interlayer insulation layers 45 are formed to the top surfaces of the protection layers 44 so as to cover the respective side surfaces of the first insulation layers 41 and the protection layers 44. The interlayer insulation layers are formed integrally and continuously with the interlayer insulation layers 36 in the memory transistor layer 30.

The first insulation layers 41, the second insulation layers 43, and the interlayer insulation layers 45 are composed of silicon oxide ($SiO_2$). The drain-side conductive layers 42a and the source-side conductive layers 42b are composed of polysilicon (p-Si). Since the protection layers 44 are composed of silicon nitride (SiN), they have a higher selection ratio associated with diluted hydrofluoric acid treatment than those of the drain-side conductive layers 42a and the source-side conductive layers 42b that are composed of polysilicon.

Furthermore, the selection transistor layer 40 has drain-side holes 46a and source-side holes 46b.

The drain-side holes 46a are formed to penetrate the interlayer insulation layer 45, the second insulation layer 43, the drain-side conductive layer 42a, and the first insulation layer 41. The source-side holes 46b are formed to penetrate the interlayer insulation layer 45, the second insulation layer 43, the source-side conductive layer 42b, and a first insulation layer 41. The drain-side holes 46a and the source-side holes 46b are formed at positions matching the memory holes 33.

The selection transistor layer 40 also has drain-side gate insulation layers 47a, source-side gate insulation layers 47b, drain-side columnar semiconductor layers 48a, source-side columnar semiconductor layers 48b, and plug conductive layers 49.

Each drain-side gate insulation layer 47a is formed on a side surface of a drain-side hole 46a and in contact with a drain-side columnar semiconductor layer 48a. Each source-side gate insulation layer 47b is formed on a side surface of a source-side hole 46b and in contact with a source-side columnar semiconductor layer 48b. Each drain-side columnar semiconductor layer 48a is formed to fill a drain-side hole 46a up to a certain height. Each source-side columnar semiconductor layer 48b is formed to fill a source-side hole 46b up to a certain height. The plug conductive layers 49 are formed on the respective top surfaces of the drain-side columnar semiconductor layers 48a and the source-side columnar semiconductor layers 48b. The plug conductive layers 49 are formed to fill up the drain-side holes 46a and the source-side holes 46b.

The drain-side gate insulation layers 47a and the source-side gate insulation layers 47b are composed of silicon nitride (SiN). The drain-side columnar semiconductor layers 48a and the source-side columnar semiconductor layers 48b are composed of polysilicon (p-Si). Each plug conductive layer 49 includes a lamination structure of tungsten (W)/titanium nitride (TiN)/titanium (Ti).

In the above-mentioned configuration of the selection transistor layer 40, the drain-side conductive layers 42a function as the control gate electrodes of drain-side selection transistors SDTr and as drain-side selection gate lines SGD. The source-side conductive layers 42b function as the control gate electrodes of source-side selection transistors SSTr and as source-side selection gate lines SGS.

The above-mentioned configuration of the selection transistor layer 40 is restated as follows: the drain-side gate insulation layers 47a are formed to surround the side surfaces of the drain-side columnar semiconductor layers 48a. The drain-side conductive layers 42a are formed to surround the side surfaces of the drain-side gate insulation layers 47a. The source-side gate insulation layers 47b are formed to surround the side surfaces of the source-side columnar semiconductor layers 48b. The source-side conductive layers 42b are formed to surround the side surfaces of the source-side gate insulation layers 47b.

The wiring layer 50 has source-line conductive layers 51, interlayer insulation layers 52, and bit-line conductive layers 53 that are deposited on the selection transistor layer 40.

Each source-line conductive layer 51 is formed in contact with the layers (the plug conductive layers 49) above a pair of source-side columnar semiconductor layers 48b adjacent in the column direction. Each source-line conductive layer 51 is formed to extend in the row direction. The interlayer insulation layers 52 are formed to cover the source-line conductive layers 51. The bit-line conductive layers 53 are formed to extend in the column direction and in a stripe pattern at a certain pitch in the row direction.

Each source-line conductive layer 51 and bit-line conductive layer 53 include a lamination structure of tungsten (W)/titanium nitride (TiN)/titanium (Ti). The interlayer insulation layers 52 are composed of silicon oxide ($SiO_2$).

The wiring layer 50 also has holes 54 and plug conductive layers 55.

The holes 54 are formed to penetrate the interlayer insulation layer 52. The holes 54 are formed at positions matching the drain-side holes 46a. The plug conductive layers 55 are formed to fill up the holes 54. Each plug conductive layer 55 includes a lamination structure of tungsten (W)/titanium nitride (TiN)/titanium (Ti).

In the above-mentioned configuration of the wiring layer 50, the source-line conductive layers 51 function as source lines SL. The bit-line conductive layers 53 function as bit lines BL.

(Manufacturing Method of Non-Volatile Semiconductor Storage Device 100 in this Embodiment)

Referring now to FIGS. 6 to 27, a method of manufacturing the non-volatile semiconductor storage device 100 according to this embodiment will be described below. FIGS. 6 to 12, FIGS. 14 to 24, and FIG. 26 are cross-sectional views of the non-volatile semiconductor storage device 100 in a manufacturing process according to this embodiment. FIG. 13 is an enlarged view of B part of FIG. 12. FIG. 25 is an enlarged view of C part of FIG. 24. FIG. 27 is an enlarged view of D part of FIG. 26.

Figure 6:
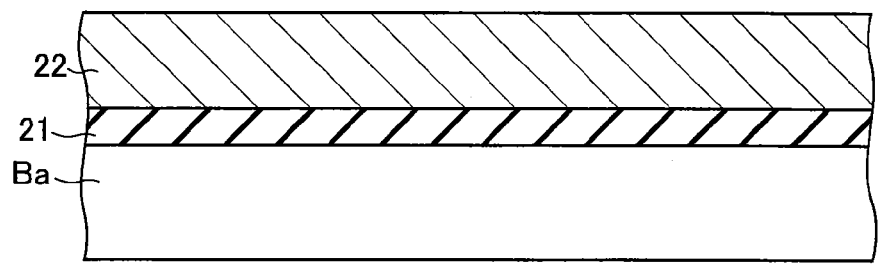
FIG. 6 is a cross-sectional view of the non-volatile semiconductor storage device 100 in a manufacturing process according to the embodiment.

Firstly, as illustrated in FIG. 6, silicon oxide ($SiO_2$) and polysilicon (p-Si) are deposited on the semiconductor substrate Ba to form a back-gate insulation layer 21 and a back-gate conductive layer 22. The polysilicon (p-Si) used here is injected with any of arsenic (As), phosphorus (P), and boron (B). For example, the back-gate insulation layer 21 is deposited 100 nm thick and the back-gate conductive layer 22 is deposited 200 nm thick.

Figure 7:
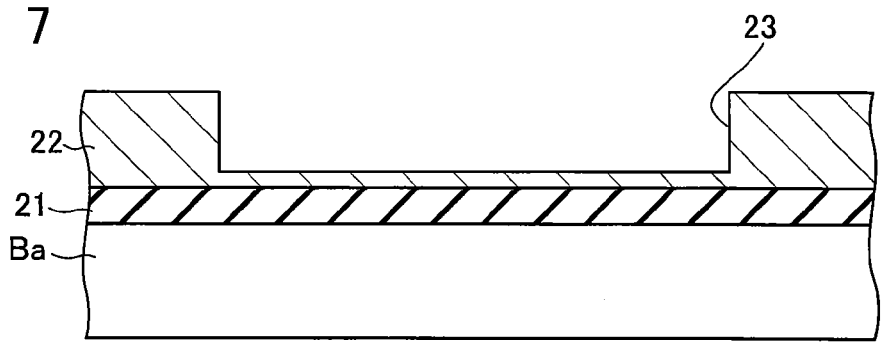
FIG. 7 is a cross-sectional view of the non-volatile semiconductor storage device 100 in the manufacturing process according to the embodiment.

Then, as illustrated in FIG. 7, the lithography or RIE (Reactive Ion Etching) method is used to dig down the back-gate conductive layer 22, thereby forming a back-gate hole 23.

Figure 8:
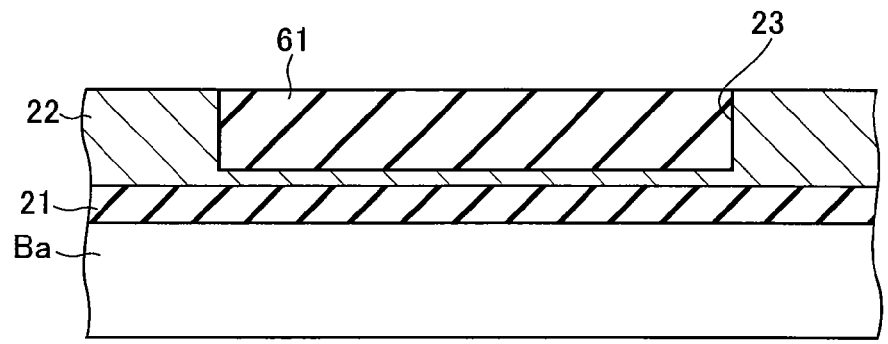
FIG. 8 is a cross-sectional view of the non-volatile semiconductor storage device 100 in the manufacturing process according to the embodiment.

Subsequently, as illustrated in FIG. 8, silicon nitride (SiN) is deposited to fill up the back-gate hole 23, by which a sacrificial layer 61 is formed.

Figure 9:
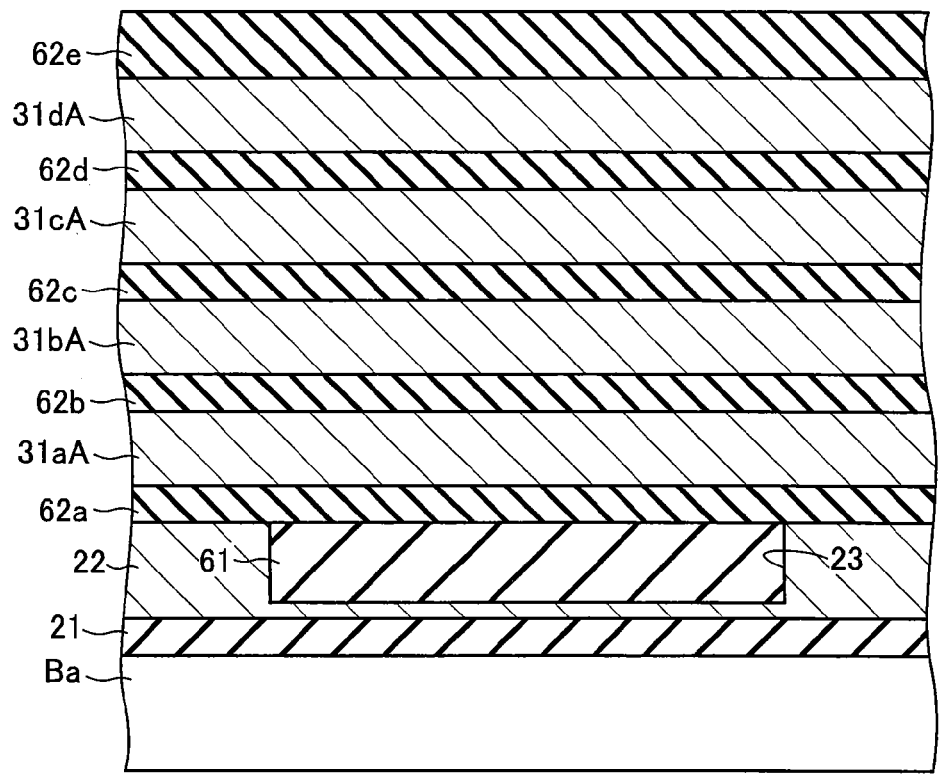
FIG. 9 is a cross-sectional view of the non-volatile semiconductor storage device 100 in the manufacturing process according to the embodiment.

Then, as illustrated in FIG. 9, silicon oxide ($SiO_2$) and polysilicon (p-Si) are alternately deposited on the back-gate conductive layer 22 and the sacrificial layer 61 to form sacrificial layers 62a to 62e and conductive layers 31aA to 31dA. The polysilicon (p-Si) used here is injected with any of arsenic (As), phosphorus (P), and boron (B).

Figure 10:
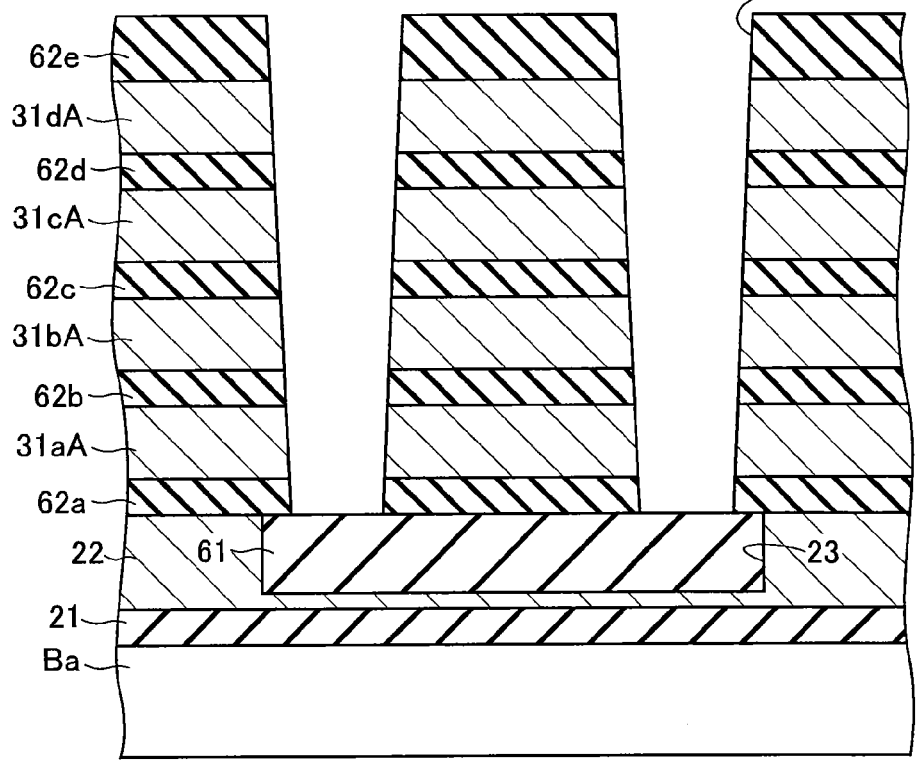
FIG. 10 is a cross-sectional view of the non-volatile semiconductor storage device 100 in the manufacturing process according to the embodiment.

Subsequently, as illustrated in FIG. 10, memory holes 33 are formed to penetrate the sacrificial layers 62a to 62e and the conductive layers 31aA to 31dA. The memory holes 33 are formed to reach the top surfaces at both ends in the column direction of the sacrificial layer 61.

Figure 11:
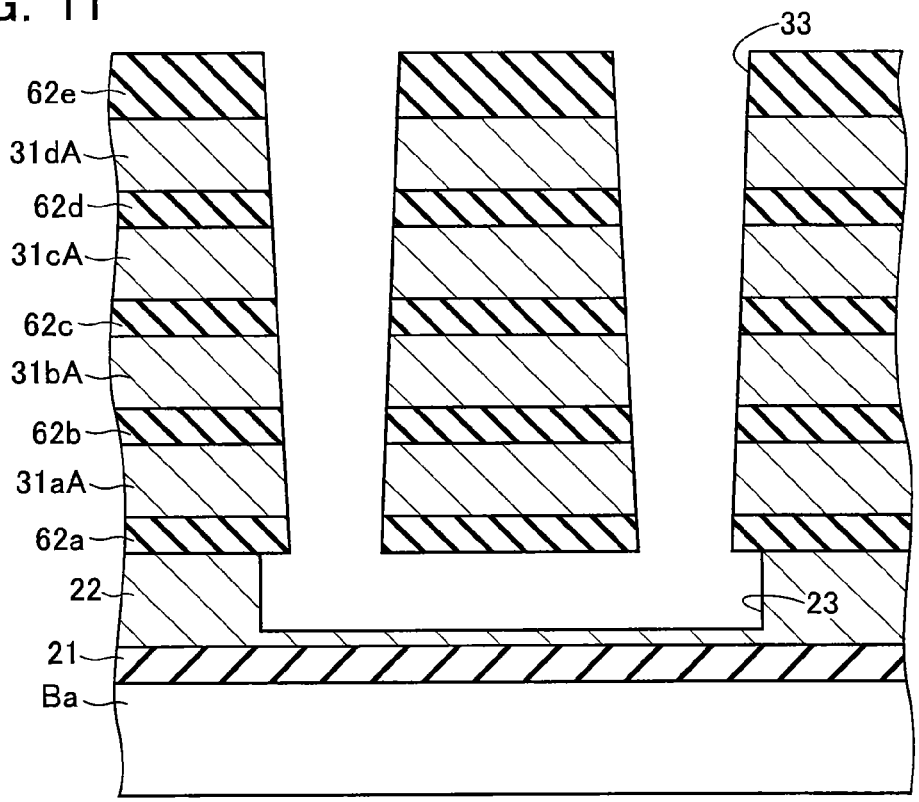
FIG. 11 is a cross-sectional view of the non-volatile semiconductor storage device 100 in the manufacturing process according to the embodiment.

Then, as illustrated in FIG. 11, a hot phosphoric acid treatment (Hot $H_3PO_4$) is performed via the memory holes 33 to remove the sacrificial layer 61.

Figure 12:
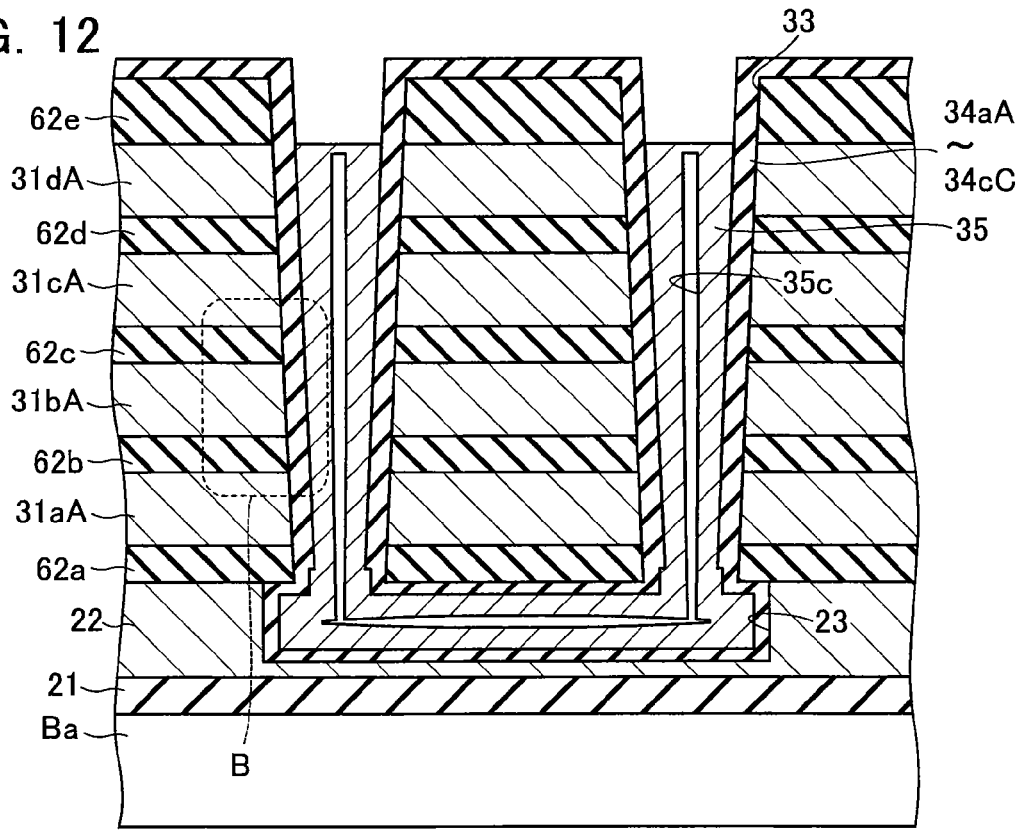
FIG. 12 is a cross-sectional view of the non-volatile semiconductor storage device 100 in the manufacturing process according to the embodiment.
Figure 13:
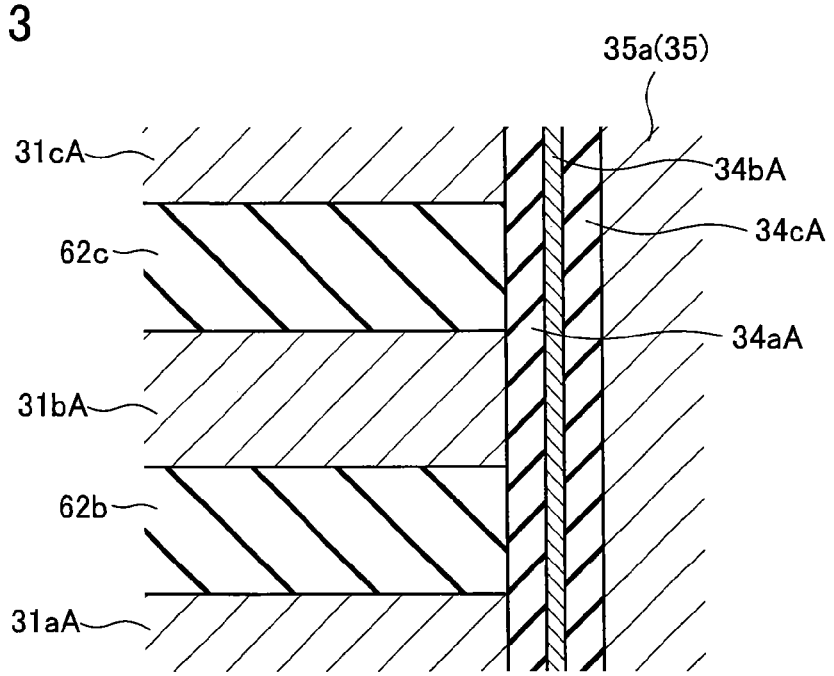
FIG. 13 is an enlarged view of B part of FIG. 12.

Subsequently, as illustrated in FIGS. 12 and 13, silicon oxide ($SiO_2$), polysilicon (p-Si), silicon oxide ($SiO_2$), and polysilicon (p-Si) are sequentially deposited on the respective side surfaces of the memory holes 33 and the back-gate hole 23. Through this step, a silicon oxide layer 34aA, a polysilicon layer 34bA, a silicon oxide layer 34cA, and a U-shaped semiconductor layer 35 are sequentially formed on the respective side surfaces of the memory holes 33 and the back-gate hole 23. Note that the U-shaped semiconductor layer 35 is formed with a hollow 35c. For example, the silicon oxide layer 34aA is deposited 10 nm thick. The polysilicon layer 34bA is deposited 10 nm thick. The silicon oxide layer 34cA is deposited 7 nm thick.

Figure 14:
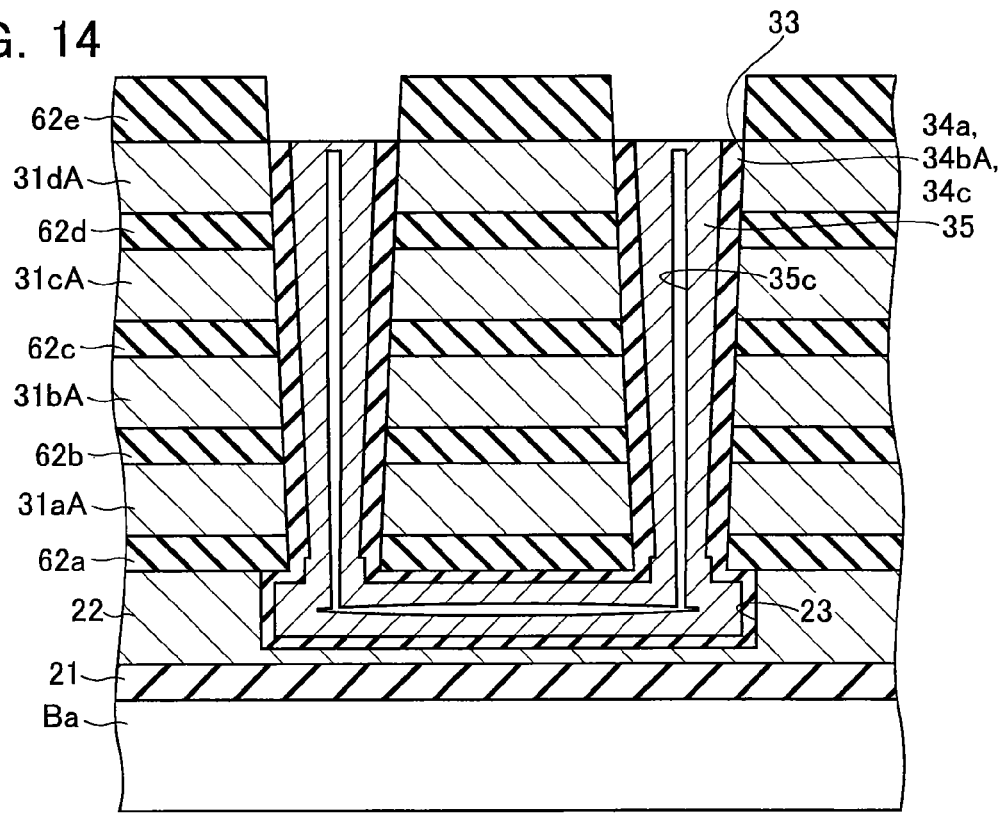
FIG. 14 is a cross-sectional view of the non-volatile semiconductor storage device 100 in a manufacturing process according to the embodiment.

Then, as illustrated in FIG. 14, the respective upper ends of the silicon oxide layer 34aA, the polysilicon layer 34bA, and the silicon oxide layer 34cA are removed by etching. Through this step, the silicon oxide layer 34aA provides a block insulation layer 34a. The silicon oxide layer 34cA provides a tunnel insulation layer 34c.

Figure 15:
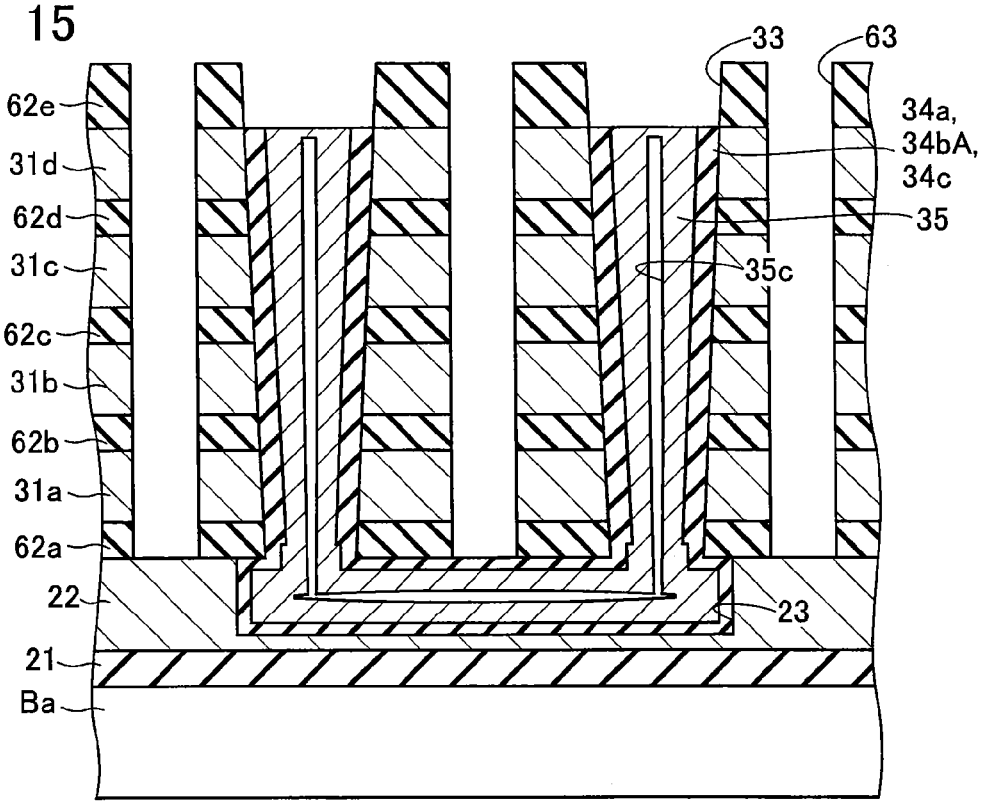
FIG. 15 is a cross-sectional view of the non-volatile semiconductor storage device 100 in the manufacturing process according to the embodiment.

Subsequently, as illustrated in FIG. 15, trenches 63 are formed to penetrate the sacrificial layers 62a to 62e and the conductive layers 31aA to 31dA. Each trench 63 is formed between the memory holes 33 adjacent in the column direction. Each trench 63 is formed to extend in the row direction. Through this step, the conductive layers 31aA to 31dA provide first to fourth word-line conductive layers 31a to 31d.

Figure 16:
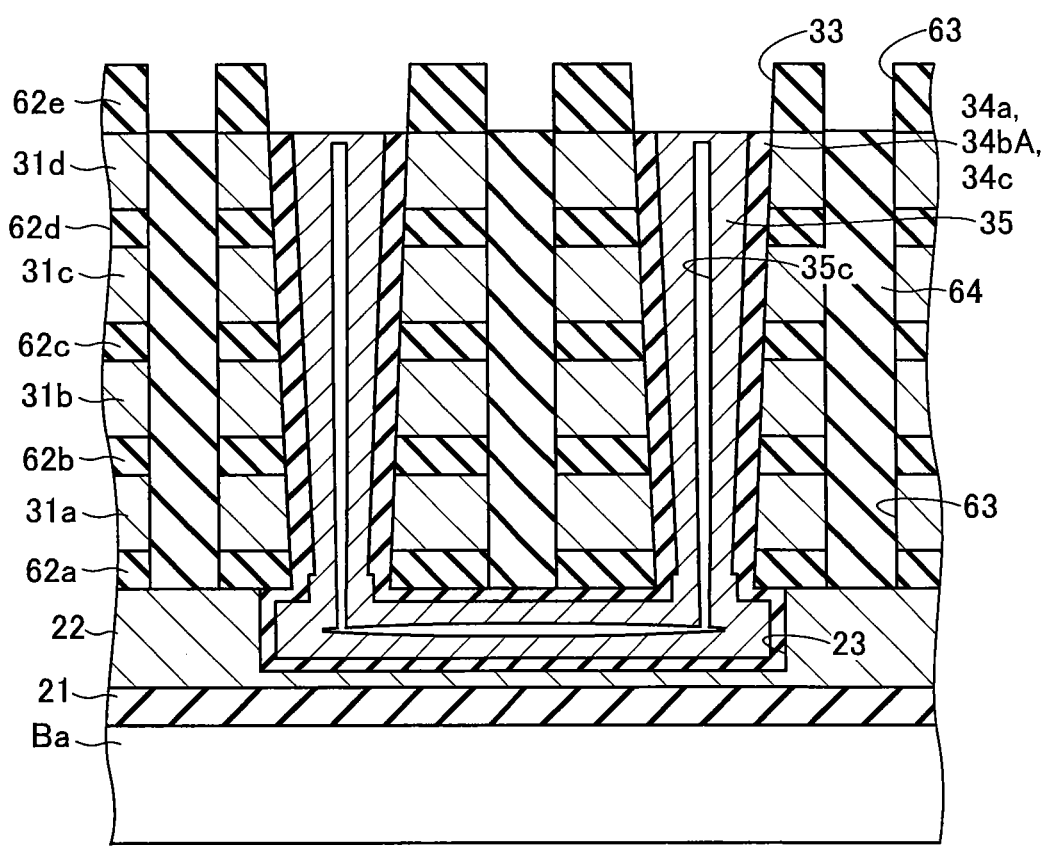
FIG. 16 is a cross-sectional view of the non-volatile semiconductor storage device 100 in the manufacturing process according to the embodiment.

Then, as illustrated in FIG. 16, polysilazane is deposited to the top surfaces of the fourth word-line conductive layers 31d so as to fill up the trenches 63, thereby forming sacrificial layers 64.

Figure 17:
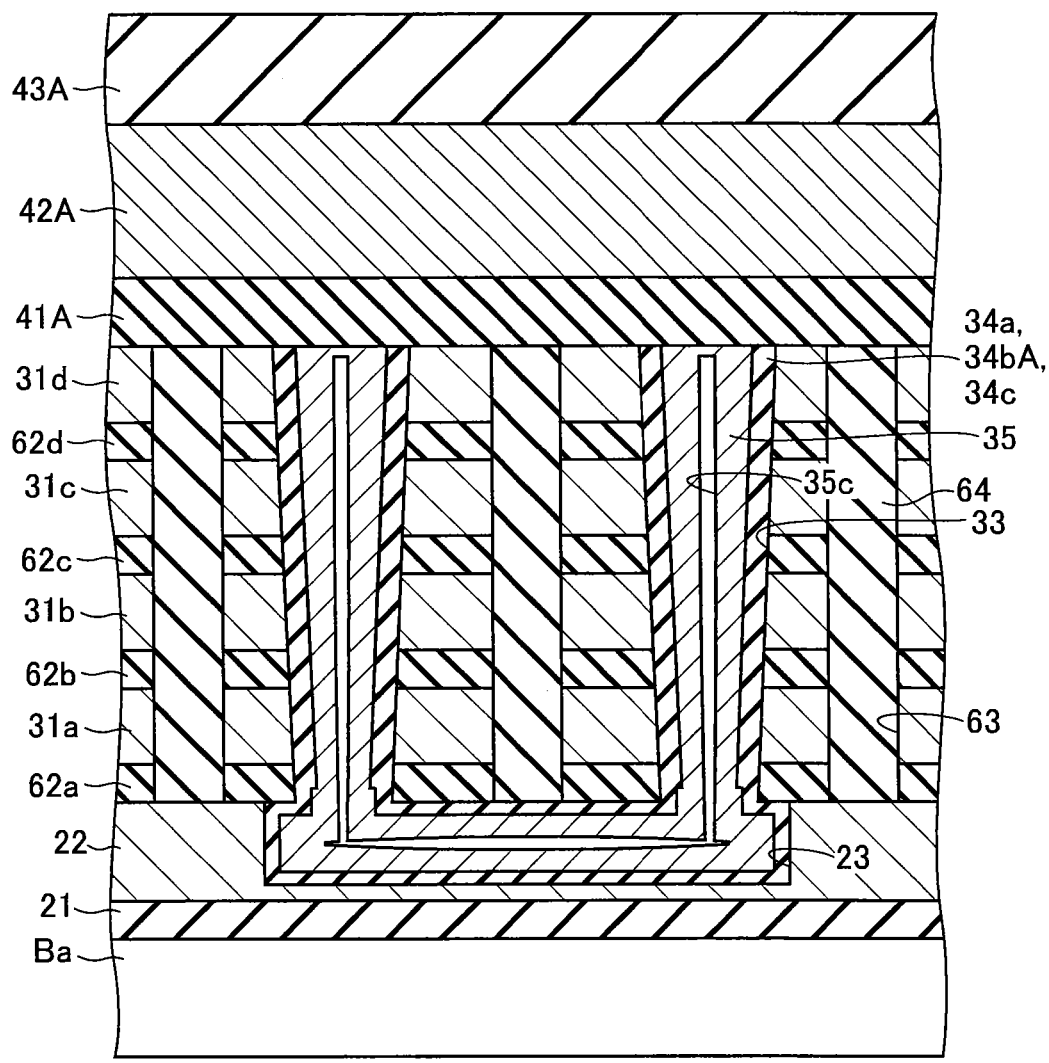
FIG. 17 is a cross-sectional view of the non-volatile semiconductor storage device 100 in the manufacturing process according to the embodiment.

Subsequently, as illustrated in FIG. 17, silicon oxide ($SiO_2$), polysilicon (p-Si), and silicon oxide ($SiO_2$) are sequentially deposited on the sacrificial layers 62e. The polysilicon (p-Si) used here is injected with any of arsenic (As), phosphorus (P), and boron (B). Through this step, the sacrificial layers 62e provide an insulation layer 41A. In addition, a conductive layer 42A and an insulation layer 43A are formed on the insulation layer 41A.

Figure 18:
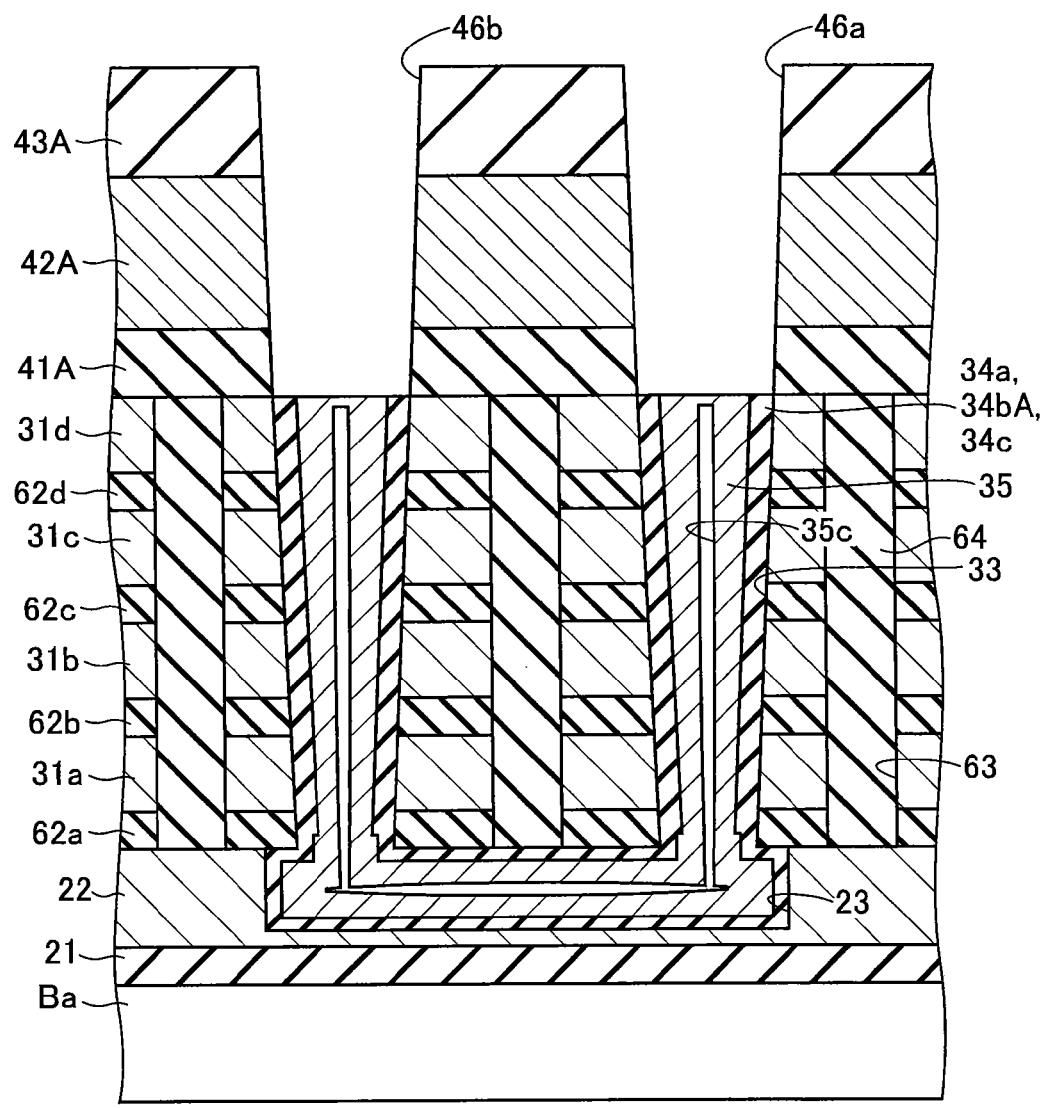
FIG. 18 is a cross-sectional view of the non-volatile semiconductor storage device 100 in the manufacturing process according to the embodiment.

Then, as illustrated in FIG. 18, a drain-side hole 46a and a source-side hole 46b are formed to penetrate the insulation layer 43A, the conductive layer 42A, and the insulation layer 41A. The drain-side hole 46a and the source-side hole 46b are formed at positions matching the memory holes 33.

Figure 19:
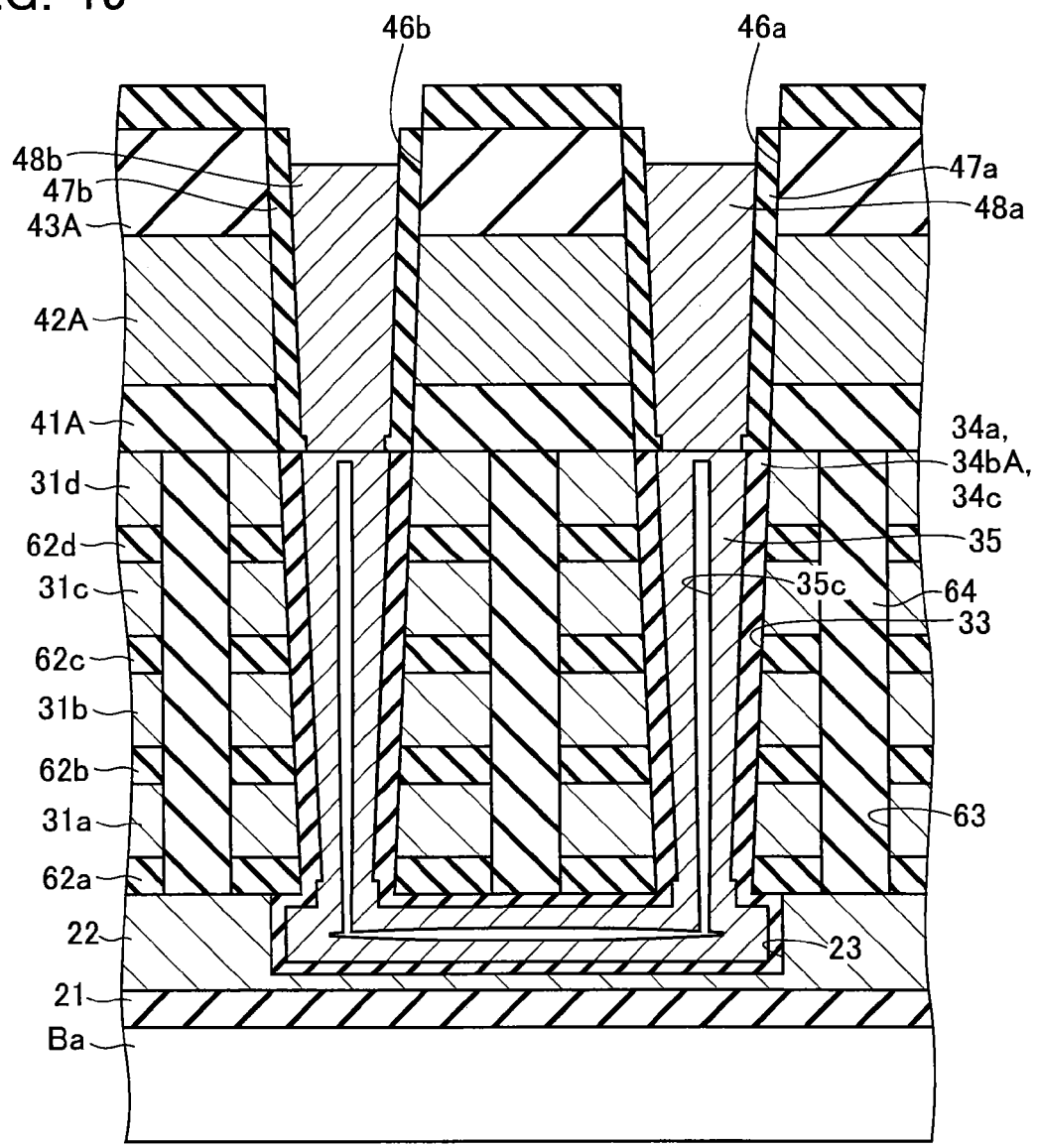
FIG. 19 is a cross-sectional view of the non-volatile semiconductor storage device 100 in the manufacturing process according to the embodiment.

Subsequently, as illustrated in FIG. 19, silicon nitride (SiN) and polysilicon (p-Si) are sequentially formed on the respective side surfaces of the drain-side hole 46a and the source-side hole 46b. Through this step, a drain-side gate insulation layer 47a is formed on aside surface of the drain-side hole 46a. A drain-side columnar semiconductor layer 48a is formed to fill up the drain-side hole 46a. In addition, a source-side gate insulation layer 47b is formed on a side surface of the source-side hole 46b. A source-side columnar semiconductor layer 48b is formed to fill up the source-side hole 46b.

Figure 20:
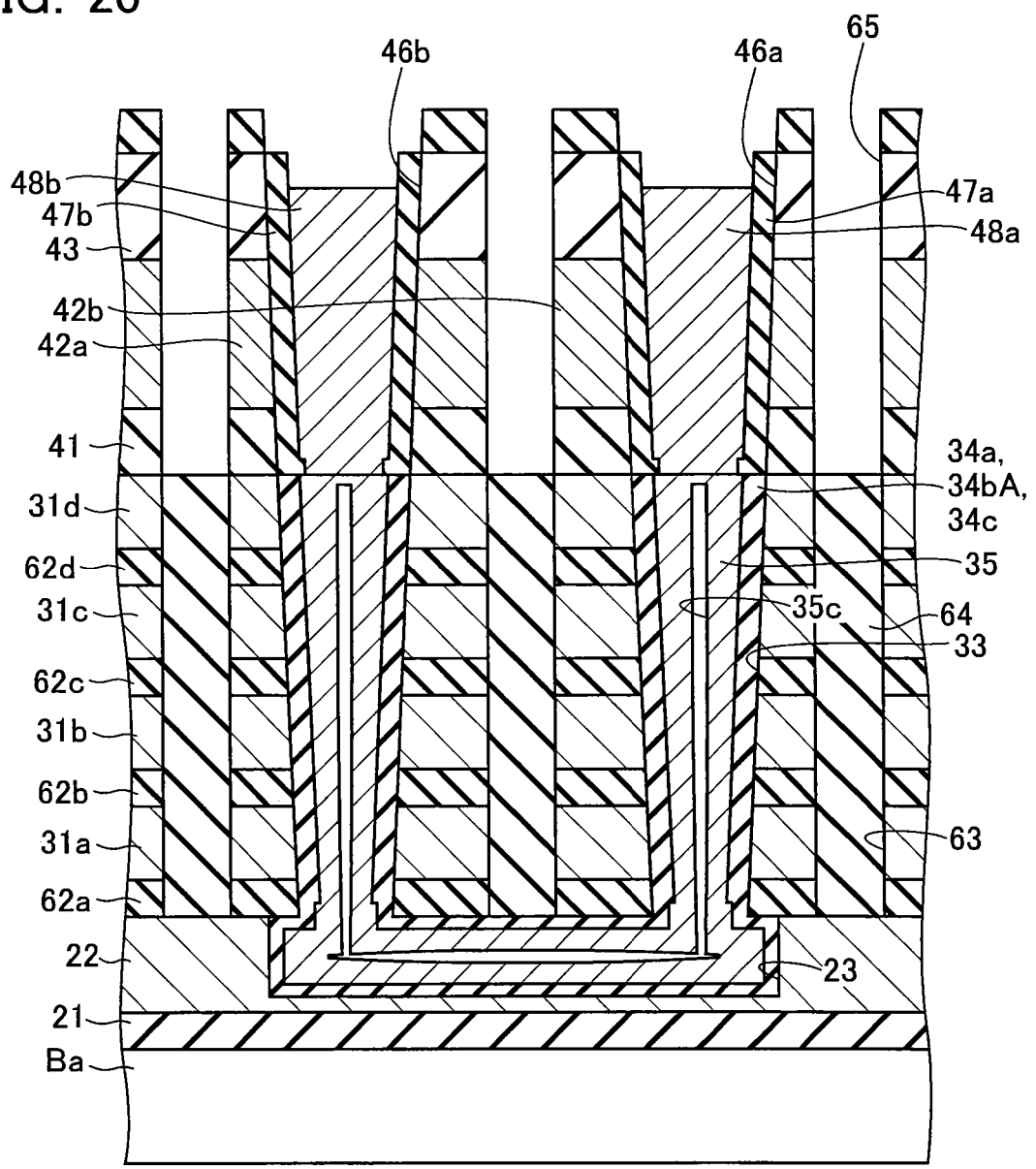
FIG. 20 is a cross-sectional view of the non-volatile semiconductor storage device 100 in the manufacturing process according to the embodiment.

Then, as illustrated in FIG. 20, trenches 65 are formed to penetrate the insulation layer 43A, the conductive layer 42A, and the insulation layer 41A. The trenches 65 are formed to extend in the row direction. The trenches 65 are formed at positions matching the trenches 63 located below. Through this step, the insulation layers 41A provide first insulation layers 41. The conductive layers 42A provide drain-side conductive layers 42a. In addition, the conductive layers 42A provide source-side conductive layers 42b. The insulation layers 43A provide second insulation layers 43.

Figure 21:
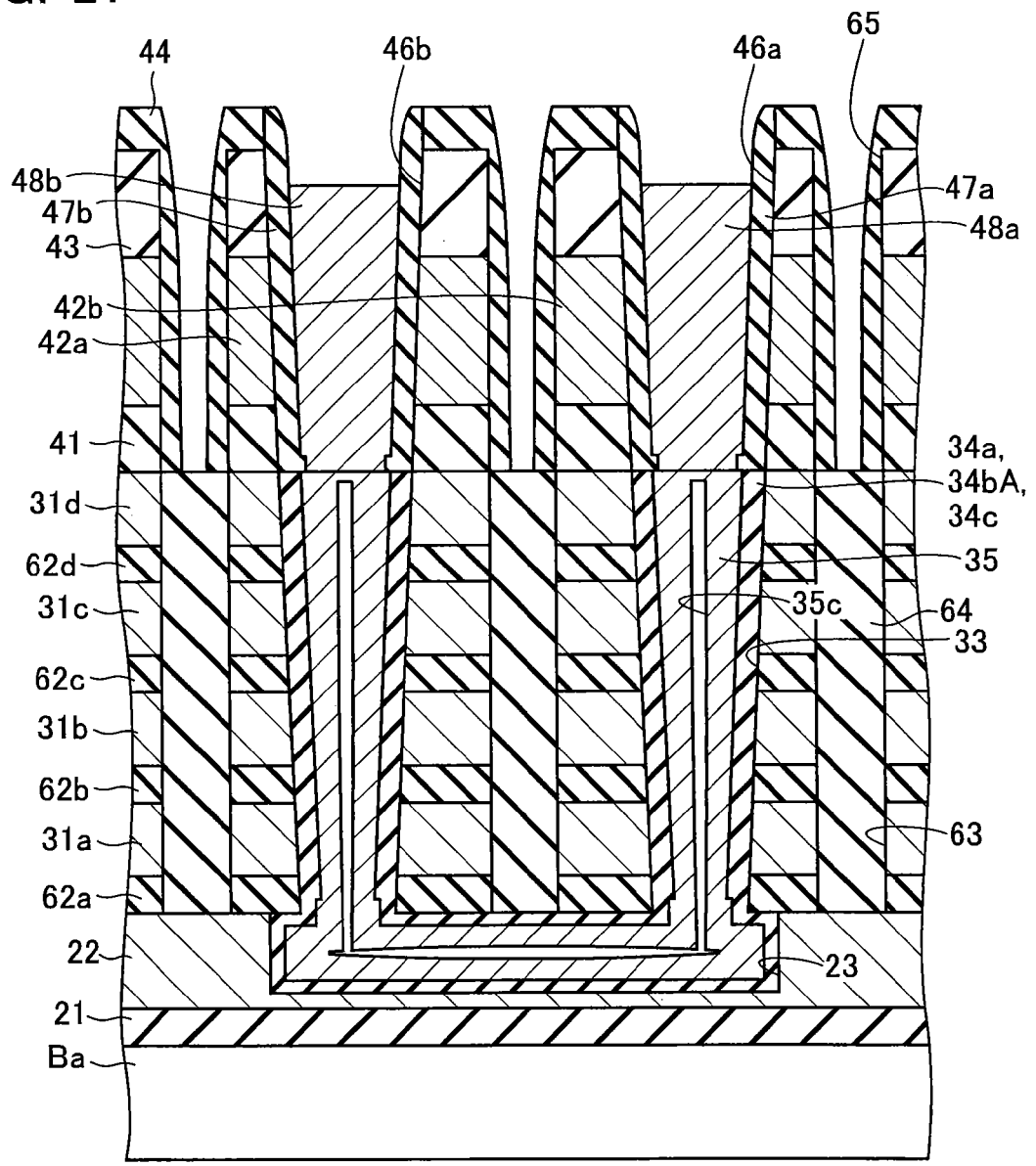
FIG. 21 is a cross-sectional view of the non-volatile semiconductor storage device 100 in the manufacturing process according to the embodiment.

Subsequently, as illustrated in FIG. 21, silicon nitride (SiN) is deposited to cover the side surfaces of the trenches 65, thereby forming protection layers 44. The silicon nitride (SiN) has resistance to hydrofluoric acid.

Figure 22:
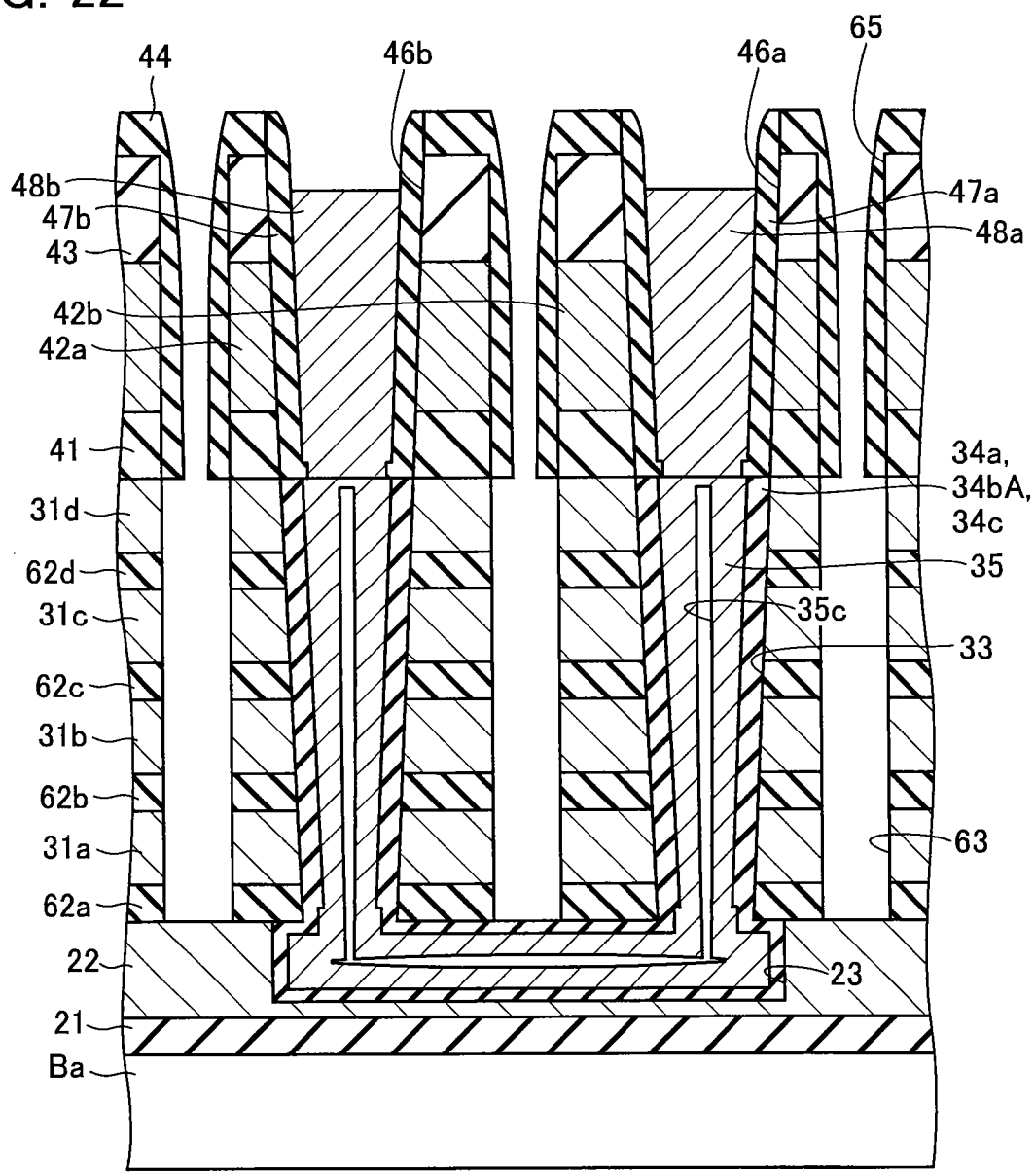
FIG. 22 is a cross-sectional view of the non-volatile semiconductor storage device 100 in the manufacturing process according to the embodiment.

Then, as illustrated in FIG. 22, a diluted hydrofluoric acid treatment is performed via the trenches 65 to selectively remove the sacrificial layers 64. At this point, the respective side surfaces of the first insulation layers 41, the drain-side conductive layers 42a (the source-side conductive layers 42b), and the second insulation layers 43 are not removed since they are covered with the protection layers 44.

Figure 23:
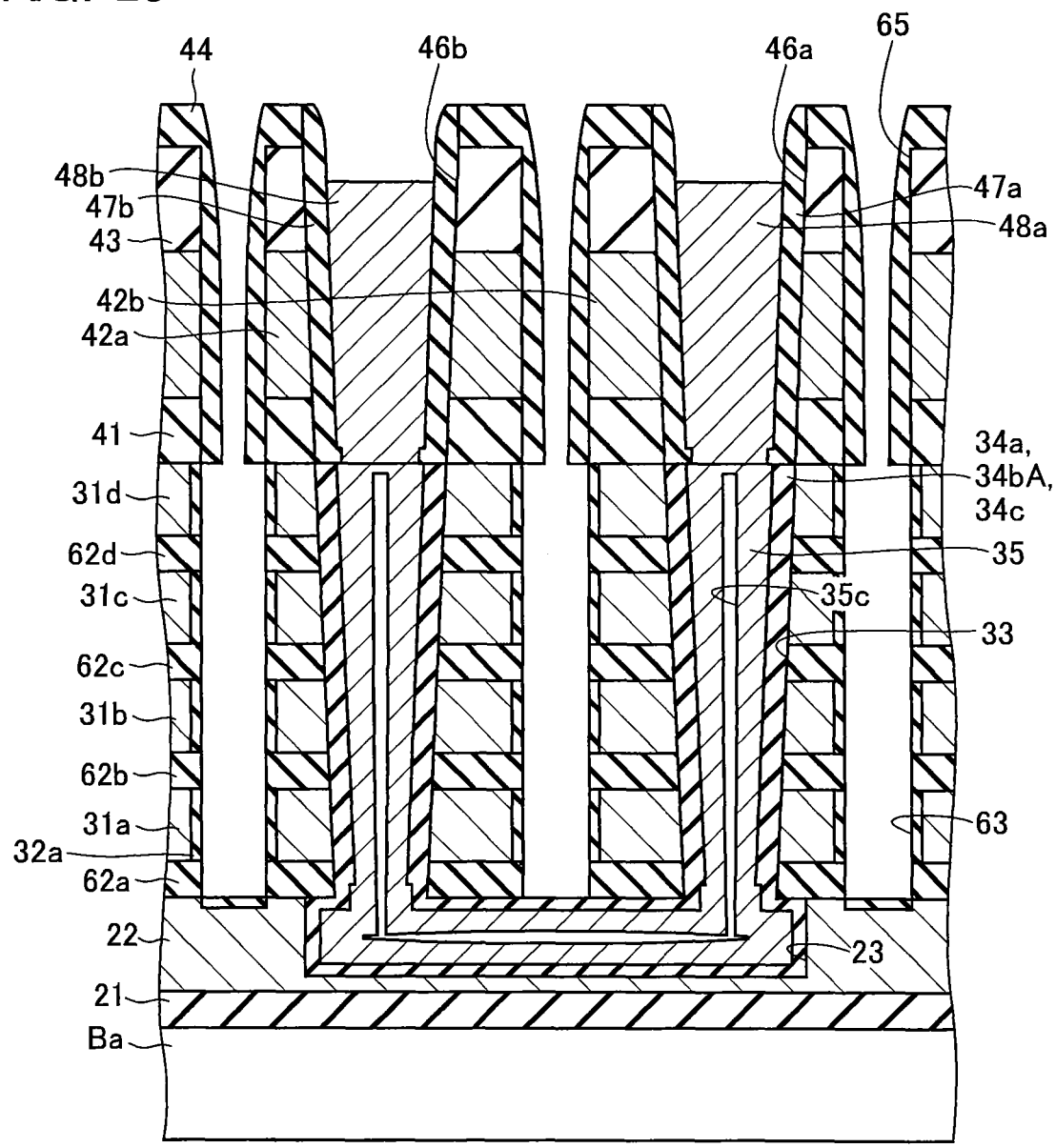
FIG. 23 is a cross-sectional view of the non-volatile semiconductor storage device 100 in the manufacturing process according to the embodiment.

Subsequently, as illustrated in FIG. 23, an ammonia nitridation process is carried out via the trenches 65 and 63 to deposit silicon nitride (SiN) on the side surfaces of the first to fourth word-line conductive layers 31a to 31d, by which protection layers 32a are formed.

Figure 24:
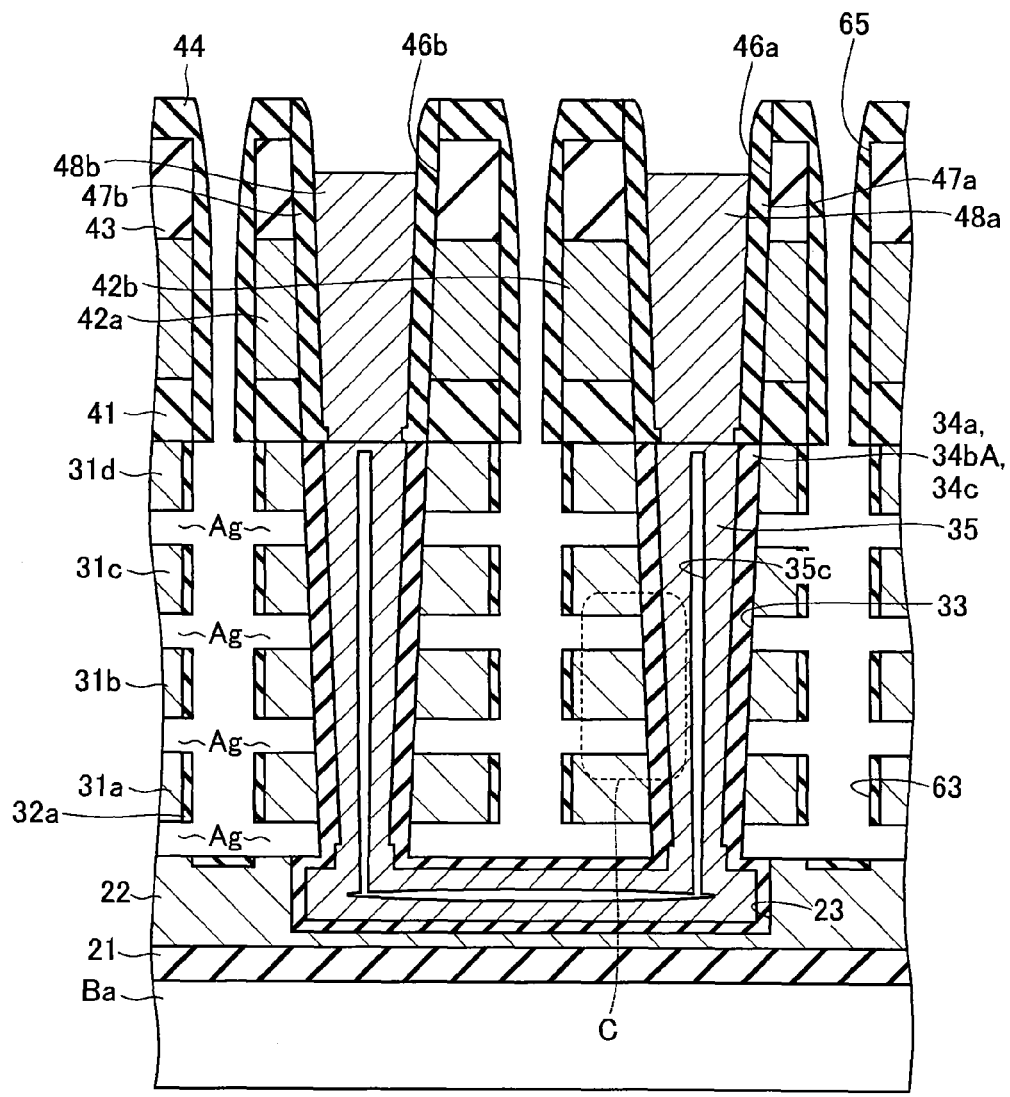
FIG. 24 is a cross-sectional view of the non-volatile semiconductor storage device 100 in the manufacturing process according to the embodiment.
Figure 25:
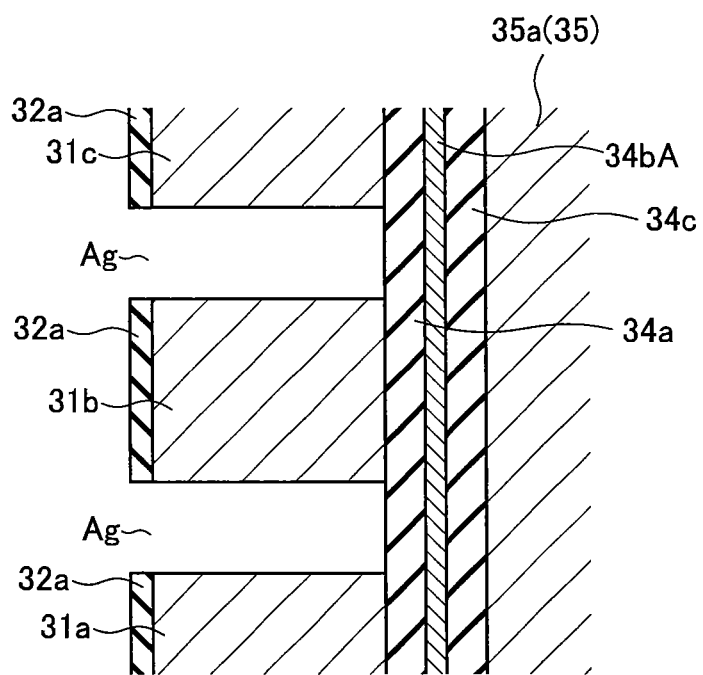
FIG. 25 is an enlarged view of C part of FIG. 24.

Then, as illustrated in FIGS. 24 and 25, the sacrificial layers 62a to 62d are removed via the trenches 65 and trenches 63. At this point, the respective side surfaces of the first to fourth word-line conductive layers 31a to 31d are not removed since they are covered with the protection layers 32a. Through this step, air gaps Ag are formed between the first to fourth word-line conductive layers 31a to 31d in the lamination direction.

Figure 26:
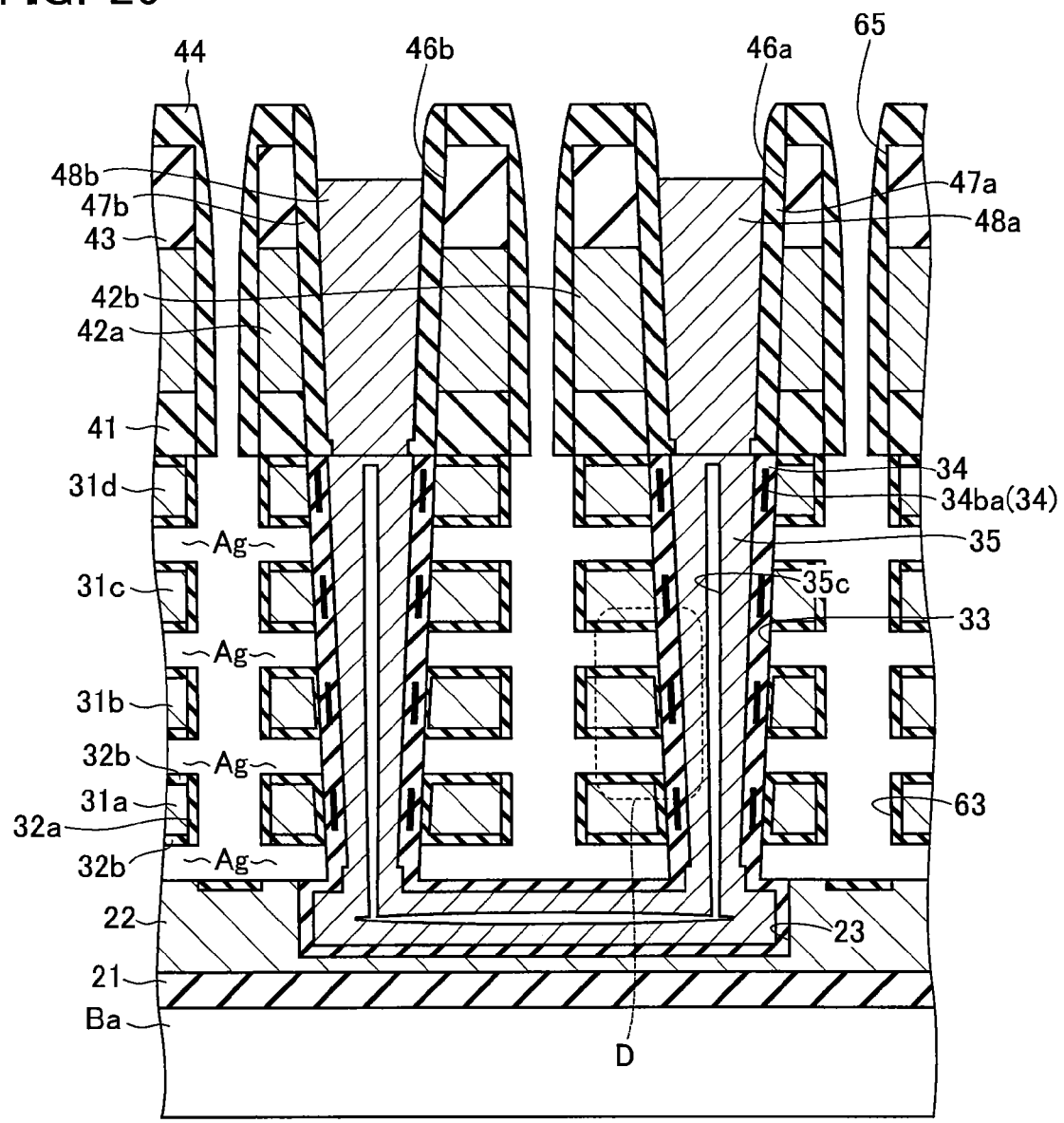
FIG. 26 is a cross-sectional view of the non-volatile semiconductor storage device 100 in a manufacturing process according to the embodiment.
Figure 27:
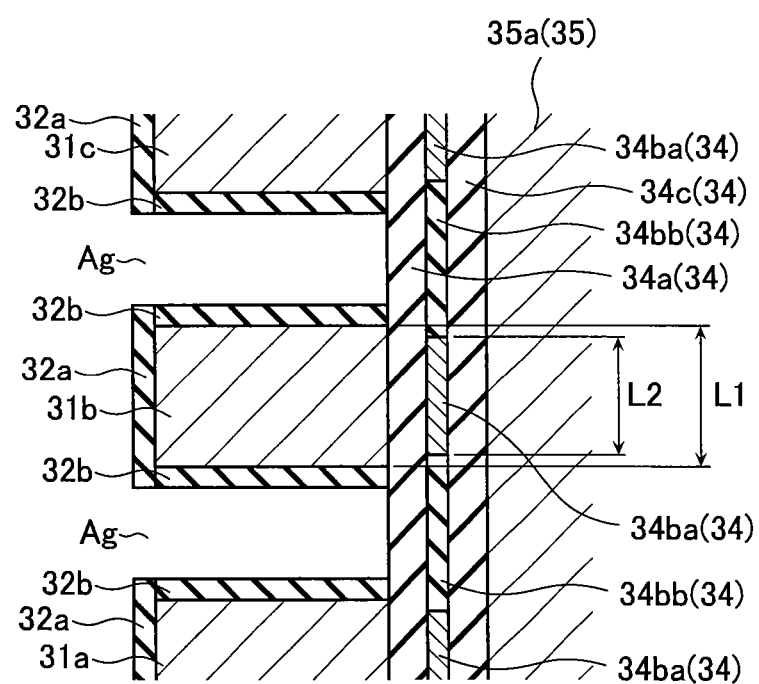
FIG. 27 is an enlarged view of D part of FIG. 26.

Subsequently, as illustrated in FIGS. 26 and 27, the polysilicon layer 34bA is oxidized via the trenches 65, the trenches 63, and the air gaps Ag. As a result, the polysilicon layer 34bA provides floating electrode layers 34ba and isolation/insulation layers 34bb. At this point, the top and bottom surfaces of the first to fourth word-line conductive layers 31a to 31d are oxidized to provide oxidized layers 32b.

Then, following the steps of FIGS. 26 and 27, silicon oxide ($SiO_2$) is deposited to fill up the trenches 65, the trenches 63, and the air gaps Ag, thereby forming interlayer insulation layers 36 and interlayer insulation layers 45 integrally and continuously with each other. In addition, tungsten (W)/titanium nitride (TiN)/titanium (Ti) are deposited to fill up the drain-side hole 46a and the source-side hole 46b, by which plug layers 49 are formed. Then, a wiring layer 50 is formed. In this way, the non-volatile semiconductor storage device 100 is formed as illustrated in FIG. 4.

(Advantages of Non-Volatile Semiconductor Storage Device 100 in this Embodiment)

Advantages of the non-volatile semiconductor storage device 100 according to the embodiment will now be described below. The non-volatile semiconductor storage device 100 of this embodiment has floating electrode layers 34ba that function as the floating gates of multiple memory transistors MTr1 to MTr8 formed at a certain pitch in the lamination direction. Therefore, any transfer of electric charges will not occur in the adjacent floating electrode layers 34ba, and hence there is no concern about the reduction in the amount of signal, and so on. That is, the non-volatile semiconductor storage device 100 according to this embodiment may ensure its reliability.

Figure 28:
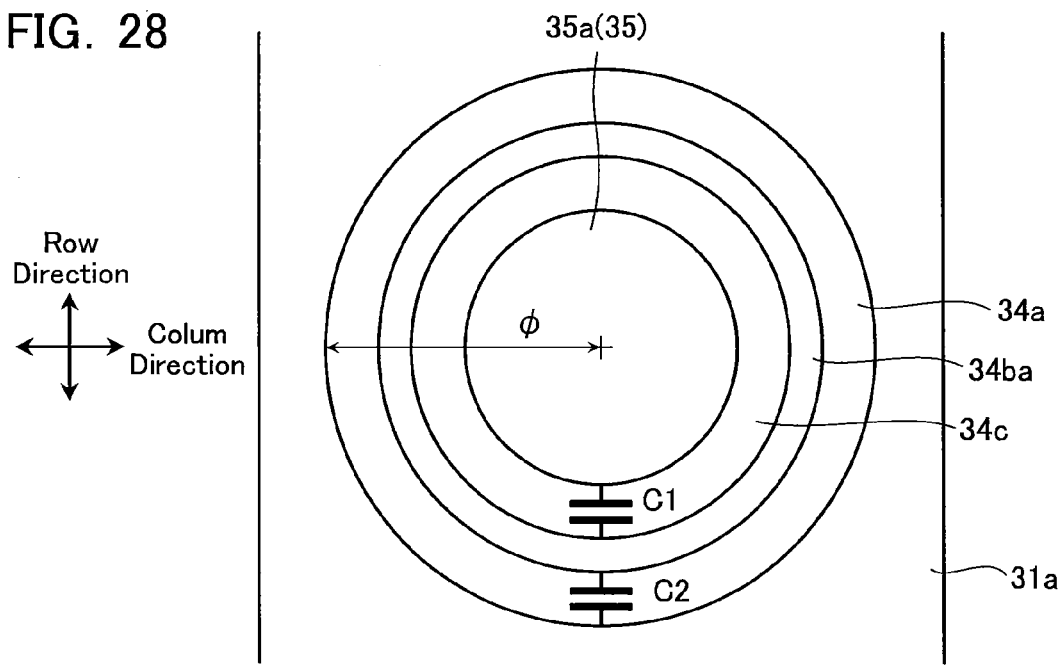
FIG. 28 is a diagram for explaining the coupling ratio according to this embodiment.
Figure 29:
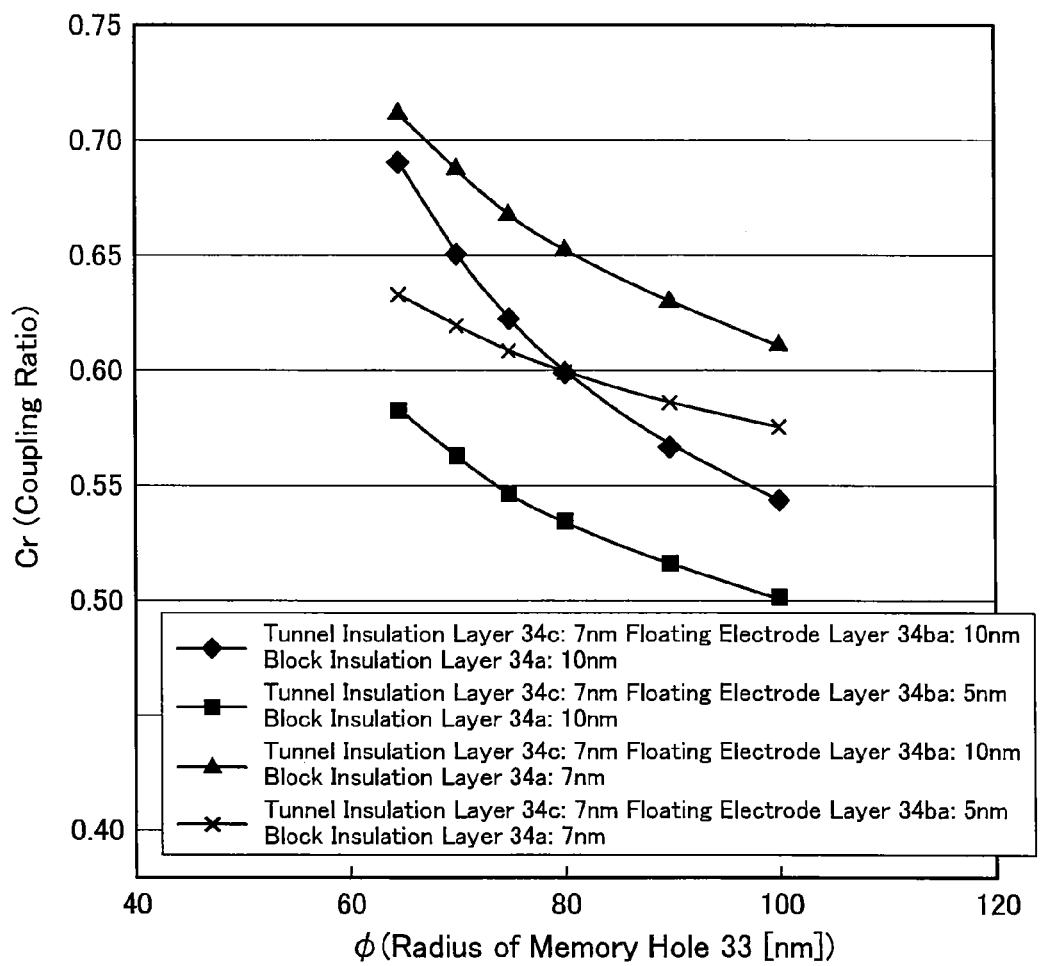
FIG. 29 illustrates the coupling ratio corresponding to the radius φ of the memory hole 33 and the thickness of the memory gate insulation layer 34.

Referring now to FIGS. 28 and 29, advantages of the coupling ratio will be described below. FIG. 28 is a diagram for explaining the coupling ratio according to this embodiment. FIG. 29 illustrates the coupling ratio corresponding to the radius $\phi$ of the memory hole 33 and the thickness of the memory gate insulation layer 34.

As illustrated in FIG. 28, let "$\phi$" be the radius of the memory hole 33. Let "C1" be a parasitic capacitance between a U-shaped semiconductor layer 35 and a floating electrode layer 34ba (floating gate). Let "C2" be a parasitic capacitance between the floating electrode layer 34ba (floating gate) and a first word-line conductive layer 31a (second to fourth word-line conductive layers 31b to 31d). Using these symbols, a coupling ratio Cr can be represented by the following Equation (1):

$$Cr = C2/(C1+C2) \qquad \text{Equation (1)}$$

In this case, generally, the memory transistors MTr1 to MTr8 cannot perform write and erase operations unless the coupling ratio Cr is at least equal to or greater than 0.5. In contrast, as illustrated in FIG. 29, the non-volatile semiconductor storage device 100 according to this embodiment may adjust the coupling ratio Cr to be equal to or greater than 0.5, by changing the thicknesses of each block insulation layer 34a, floating electrode layer 34ba, and tunnel insulation layer 34c, as well as the radius $\phi$ of each memory hole 33.

[Other Embodiments]

While an embodiment of the non-volatile semiconductor storage device has been described, the present invention is not intended to be limited to the disclosed embodiment, and various other changes, additions, substitutions or the like may be made thereto without departing from the spirit of the invention.

For example, each U-shaped semiconductor layer 35 is formed with a hollow 35c in the above-described embodiment. However, each U-shaped semiconductor layer may be configured to be filled up with polysilicon without any hollow 35c therein. This configuration can be achieved by completely filling up the memory holes 33 and the back-gate holes 23 with polysilicon at the steps of FIGS. 12 and 13.

What is claimed is:

1. A method of manufacturing a non-volatile semiconductor storage device having a plurality of memory strings each having a plurality of electrically rewritable memory cells connected in series, the method comprising:
   forming a plurality of first conductive layers above a substrate, with first interlayer insulation layers sandwiched between the plurality of first conductive layers;
   forming first holes to penetrate the plurality of first conductive layers and the first interlayer insulation layers;
   sequentially forming a second conductive layer and a first semiconductor layer on a side surface of each of the first holes, the second conductive layer surrounded by an insulation layer;
   forming first trenches to penetrate the plurality of first conductive layers and the first interlayer insulation layers, the first trenches extending in a first direction parallel to the substrate;
   removing the first interlayer insulation layers via the first trenches to form air gaps between the first conductive layers aligned in a vertical direction with respect to the substrate; and
   oxidizing parts of the second conductive layers via the first trenches and the air gaps.

2. The method of manufacturing the non-volatile semiconductor storage device according to claim 1, wherein the second conductive layer is formed of polysilicon.

3. The method of manufacturing the non-volatile semiconductor storage device according to claim 1, further comprising, after the first trenches are formed and before the air gaps are formed, forming first protection layers on side surfaces, facing the first trenches, of the first conductive layers,
   wherein the first protection layers are formed with a higher selection ratio associated with diluted hydrofluoric acid treatment than that of the first conductive layers.

4. The method of manufacturing the non-volatile semiconductor storage device according to claim 3, wherein the first protection layers are formed of silicon nitride.

5. The method of manufacturing the non-volatile semiconductor storage device according to claim 4, wherein the second conductive layer is formed of polysilicon.

6. The method of manufacturing the non-volatile semiconductor storage device according to claim 1, further comprising, after the first trenches are formed and before the air gaps are formed:
   filling up the first trenches with a sacrificial layer;
   depositing a third conductive layer above the sacrificial layer and the first conductive layers via a second interlayer insulation layer;
   forming second holes at a position matching the first holes so as to penetrate the second interlayer insulation layer and the third conductive layer;
   forming sequentially an insulation layer and a second semiconductor layer on side surfaces of the second holes;
   forming second trenches at positions matching the first trenches so as to penetrate the second interlayer insulation layer and the third conductive layer, the second trenches extending in the first direction;

forming a second protection layer on a side surface of the third conductive layer facing the second trenches; and removing the sacrificial layer via the second trenches, wherein the second protection layer is formed with a higher selection ratio associated with diluted hydrofluoric acid treatment than that of the third conductive layer.

7. The method of manufacturing the non-volatile semiconductor storage device according to claim 6, wherein the second protection layer is formed of silicon nitride.

8. The method of manufacturing the non-volatile semiconductor storage device according to claim 7, wherein the second conductive layer is formed of polysilicon.

* * * * *